US 6,791,176 B2
United States Patent
Mathieu et al.

(10) Patent No.: US 6,791,176 B2
(45) Date of Patent: Sep. 14, 2004

(54) LITHOGRAPHIC CONTACT ELEMENTS

(75) Inventors: Gaetan L. Mathieu, Livermore, CA (US); Benjamin N. Eldridge, Danville, CA (US); Gary W. Grube, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 09/777,348

(22) Filed: Feb. 5, 2001

(65) Prior Publication Data

US 2001/0039109 A1 Nov. 8, 2001

Related U.S. Application Data

(62) Division of application No. 09/205,023, filed on Dec. 2, 1998, now Pat. No. 6,255,126.

(51) Int. Cl.$^7$ .......................... H01L 23/48; H01L 23/52
(52) U.S. Cl. ...................... 257/690; 257/691; 257/692; 257/693; 257/620; 438/14; 438/15; 438/50; 438/52
(58) Field of Search ................................. 257/499, 129, 257/698, 692, 690, 784, 786, 678, 685, 691, 693, 620; 438/14, 15, 109, 110, 117, 617, 50, 52

(56) References Cited

U.S. PATENT DOCUMENTS

| 4,312,117 A | 1/1982 | Robillard et al. |
| 4,961,052 A | 10/1990 | Tada et al. ................... 324/754 |
| 5,032,896 A | 7/1991 | Little et al. ................... 257/686 |
| 5,177,438 A | 1/1993 | Littlebury et al. |
| 5,308,443 A | 5/1994 | Sugihara ....................... 216/18 |
| 5,342,737 A | 8/1994 | Georger, Jr. et al. ......... 430/324 |
| 5,354,712 A | 10/1994 | Ho et al. ..................... 438/643 |
| 5,452,268 A | 9/1995 | Bernstein ..................... 367/181 |
| 5,465,611 A | 11/1995 | Ruf et al. |
| 5,476,818 A | 12/1995 | Yanof et al. |

(List continued on next page.)

FOREIGN PATENT DOCUMENTS

| DE | 19736674 | 11/1998 | |
| EP | 0413042 A1 | 8/1989 | .......... G01N/27/00 |
| GB | 1446196 | 8/1976 | |
| JP | 60025073 | 2/1985 | |
| JP | 4-93157 | 8/1992 | |

(List continued on next page.)

OTHER PUBLICATIONS

Kong et al., "Integrated Electrostatically Resonant Scan Tip For An Atomic Force Microscope," J. Vac. Sci. Technol. B 11(3), May/Jun. 1993.

(List continued on next page.)

Primary Examiner—Matthew Smith
Assistant Examiner—V. Yevsikov
(74) Attorney, Agent, or Firm—N. Kenneth Burraston

(57) ABSTRACT

A method of forming an interconnection, including a spring contact element, by lithographic techniques. In one embodiment, the method includes applying a masking material over a first portion of a substrate, the masking material having an opening which will define a first portion of a spring structure, depositing a structure material (e.g., conductive material) in the opening, and overfilling the opening with the structure material, removing a portion of the structure material, and removing a first portion of the masking material. In this embodiment, at least a portion of the first portion of the spring structure is freed of masking material. In one aspect of the invention, the method includes planarizing the masking material layer and structure material to remove a portion of the structure material. In another aspect, the spring structure formed includes one of a post portion, a beam portion, and a tip structure portion.

38 Claims, 18 Drawing Sheets

U.S. PATENT DOCUMENTS

| | | | |
|---|---|---|---|
| 5,513,430 A | | 5/1996 | Yanof et al. |
| 5,518,964 A | * | 5/1996 | DiStefano et al. |
| 5,606,128 A | | 2/1997 | Araki ...................... 73/514.16 |
| 5,629,137 A | | 5/1997 | Leedy |
| 5,632,631 A | | 5/1997 | Fjelstad et al. |
| 5,656,941 A | * | 8/1997 | Bishop et al. ............... 324/754 |
| 5,666,190 A | | 9/1997 | Quate et al. ................... 355/71 |
| 5,723,894 A | | 3/1998 | Ueno et al. |
| 5,759,014 A | | 6/1998 | Van Lintel ............... 417/413.3 |
| 5,776,663 A | | 7/1998 | Roh |
| 5,786,270 A | | 7/1998 | Gorrell et al. ............... 438/613 |
| 5,812,357 A | * | 9/1998 | Johansen et al. ............ 361/212 |
| 5,828,226 A | | 10/1998 | Higgins et al. ............. 324/762 |
| 5,829,128 A | | 11/1998 | Eldridge et al. ............... 29/855 |
| 5,897,326 A | * | 4/1999 | Eldridge et al. ............... 438/14 |
| 5,966,587 A | | 10/1999 | Karavakis et al. ............ 438/15 |
| 5,973,394 A | * | 10/1999 | Slocum et al. ............... 257/690 |
| 5,994,152 A | * | 11/1999 | Khandros et al. ........... 438/117 |
| 6,001,663 A | | 12/1999 | Ling et al. ..................... 438/17 |
| 6,023,103 A | * | 2/2000 | Chang et al. ............... 257/781 |
| 6,031,282 A | | 2/2000 | Jones et al. |
| 6,059,982 A | | 5/2000 | Palagonia et al. |
| 6,072,190 A | * | 6/2000 | Watanabe et al. ............. 257/48 |
| 6,080,596 A | | 6/2000 | Vindasius et al. ............ 438/15 |
| 6,117,694 A | | 9/2000 | Smith et al. ................... 438/14 |
| 6,140,581 A | * | 10/2000 | Cowan et al. ............. 174/52.4 |
| 6,174,744 B1 | | 1/2001 | Watanabe et al. |
| 6,184,053 B1 | | 2/2001 | Eldridge et al. |
| 6,194,291 B1 | * | 2/2001 | DiStefano et al. .......... 438/455 |
| 6,307,392 B1 | | 10/2001 | Soejima et al. |
| 6,452,407 B2 | | 9/2002 | Khoury et al. |
| 6,520,778 B1 | | 2/2003 | Eldridge et al. |

FOREIGN PATENT DOCUMENTS

| | | | |
|---|---|---|---|
| JP | 042146650 | 8/1992 | |
| JP | 05-198716 | 8/1993 | |
| JP | 06018555 | 1/1994 | |
| JP | 7-007052 | 1/1995 | |
| JP | 07-021968 | 1/1995 | |
| JP | 7333232 | 12/1995 | |
| JP | 09-018118 | 1/1997 | |
| JP | 09-203769 | 8/1997 | |
| JP | 09-203770 | 8/1997 | |
| JP | 10-142259 | 5/1998 | |
| WO | WO 96/37322 | 11/1996 | |
| WO | WO 96/37332 | 11/1996 | ........... B23K/31/02 |
| WO | WO 97/44676 | 11/1997 | |
| WO | WO 98/52224 | 11/1998 | ........... H01L/23/48 |

OTHER PUBLICATIONS

Leung et al., "Active Substrate Membrane Probe Card," Center For Integrated Systems, Stanford University (Oct. 12, 1995).

* cited by examiner

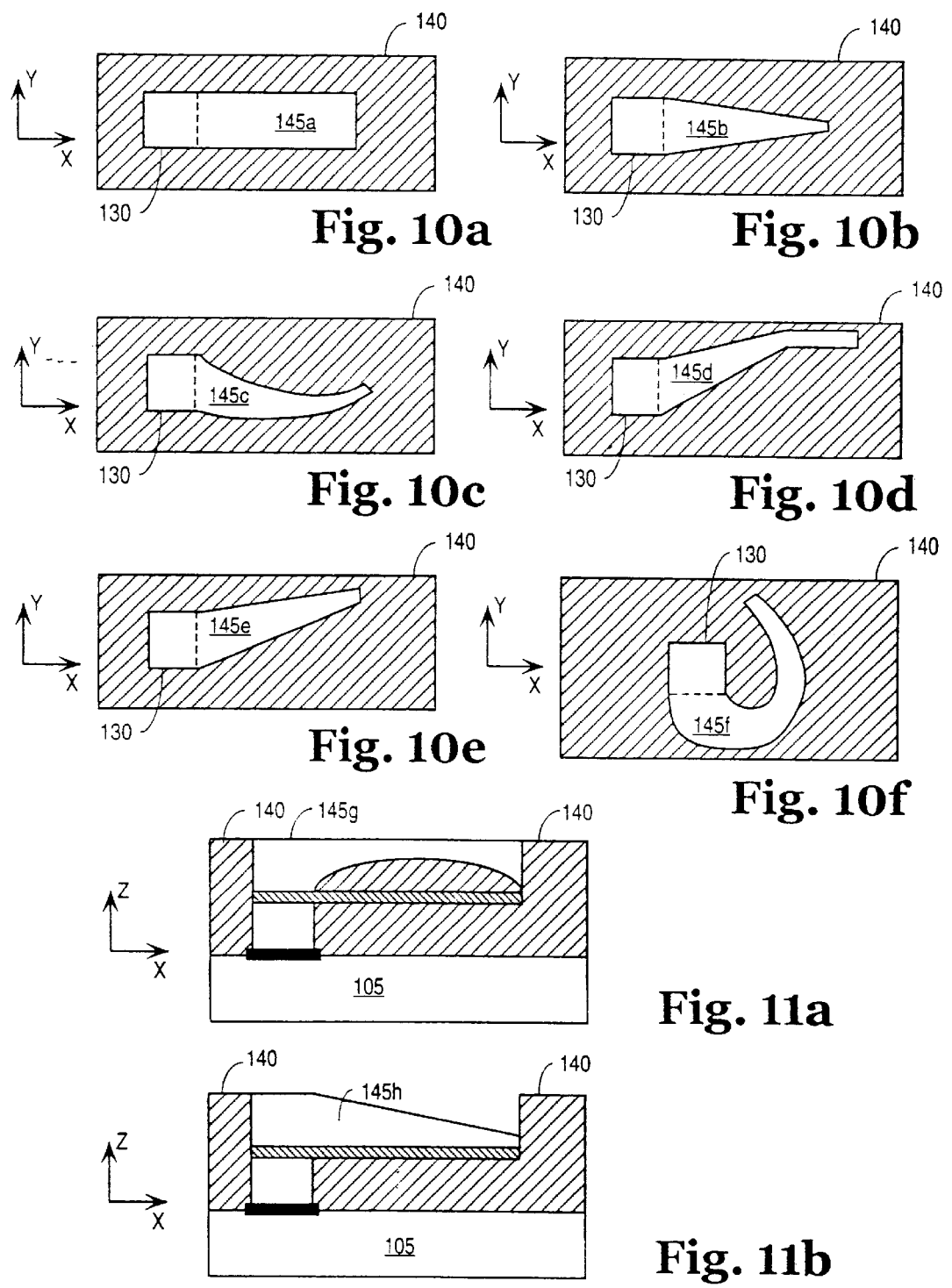

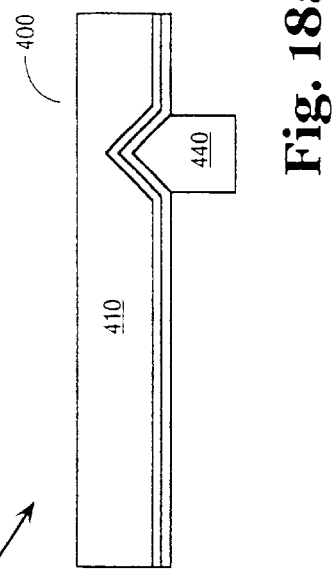
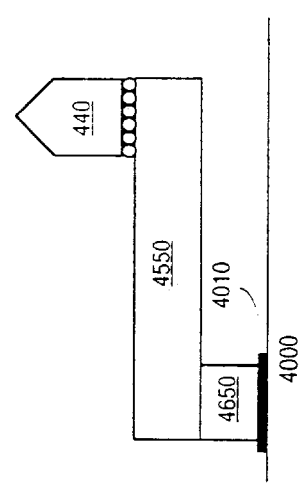
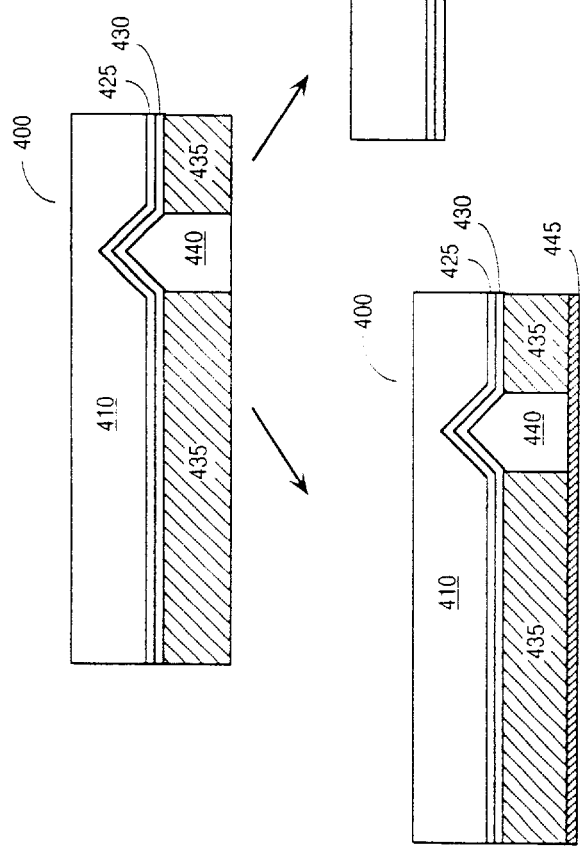
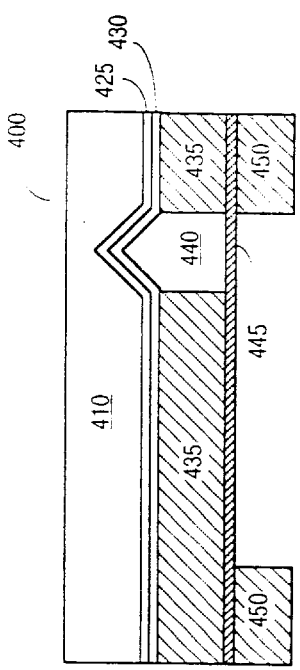
Fig. 17
Fig. 18a
Fig. 18b
Fig. 19a
Fig. 19b

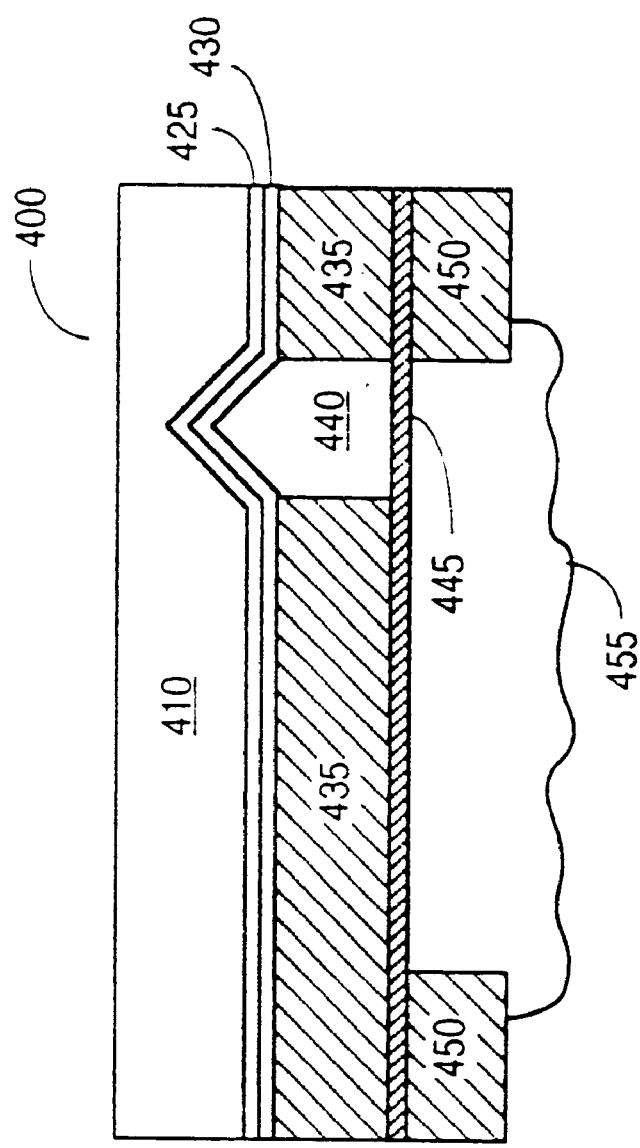

LITHOGRAPHIC CONTACT ELEMENTS

This is a Divisional application of Ser. No. 09/205,023, filed Dec. 2, 1998 now U.S. Pat. No. 6,255,126.

BACKGROUND OF THE INVENTION

1. Field of the Invention

The invention relates to an interconnection (contact) element suitable for effective pressure connections between electronic components.

2. Description of Related Art

Interconnection or contact elements may be used to connect devices of an electronic component or one electronic component to another electronic component. For example, a contact element may be used to connect two circuits of an integrated circuit chip or including an application specific integrated circuit (ASIC). Contact elements may also be used to connect the integrated circuit chip to a chip package suitable for mounting on a printed circuit board of a computer or other electronic device. Contact elements may further be used to connect the integrated circuit chip to a test device such as a probe card assembly or other printed circuit board (PCB) to test the chip.

Generally, interconnection or contact elements between electronic components can be classified into at least the two broad categories of "relatively permanent" and "readily demountable."

An example of a "relatively permanent" contact element is a wire bond. Once two electronic components are connected to one another by a bonding of a contact element to each electronic component, a process of unbonding must be used to separate the components. A wire bond contact element, such as between an integrated circuit chip or die and inner leads of a chip or package (or inner ends of lead frame fingers) typically utilizes a "relatively permanent" contact element.

One example of a "readily demountable" contact element is the contact element between rigid pins of one electronic component received by resilient socket elements of another electronic component. A second type of a "readily demountable" contact element is a contact element that itself is resilient or spring-like or mounted in or on a spring or resilient medium. An example of a contact element is a tungsten needle of a probe card component. The contact element of a probe card component is typically intended to effect a temporary pressure connection between an electronic component to which the spring contact element is mounted and terminals of a second electronic component, such as a semiconductor device under test.

With regard to spring contact elements, generally, a certain minimum contact force is desired to effect reliable pressure contact to an electronic component (e.g., to terminals on electronic component). For example, a contact (load) force of approximately 15 grams (including as little as 2 grams or less and as much as 150 grams or more, per terminal) may be desired to effect a reliable electrical pressure connection to a terminal of an electronic component.

A second factor of interest with regard to spring contact elements is the shape and metallurgy of the portion of the spring contact element making pressure connection to the terminal of the electronic component. With respect to the tungsten needle as a spring contact element, for example, the contact end is limited by the metallurgy of the interconnection element (e.g., tungsten) and, as the tungsten needle becomes smaller in diameter, it becomes commensurately more difficult to control or establish a desired shape at the contact end.

In certain instances, spring contact elements themselves are not resilient, but rather are supported by a resilient membrane. Membrane probes exemplify this situation, where a plurality of microbumps are disposed on a resilient membrane. Again, the technology required to manufacture such contact elements limits the design choices for the shape and metallurgy of the contact portion of the contact elements.

Commonly-owned U.S. patent application Ser. No. 08/152,812 filed Nov. 16, 1993 (not U.S. Pat. No. 4,576,211, issued Dec. 19, 1995), and its counterpart commonly-owned co-pending "divisional" U.S. patent application Ser. No. 08/457,479 filed Jun. 1, 1995 (status: pending) and Ser. No. 08/570,230 filed Dec. 11, 1995 (status: pending), all by Khandros, disclose methods for making spring contact elements. In a preferred embodiment, these spring contact elements, which are particularly useful for micro-electronic applications, involve mounting an end of a flexible elongate core element (e.g., wire "stem" or "skeleton") to a terminal on an electronic component, coating the flexible core element and adjacent surface of the terminal with a "shell" of one or more materials. One of skill in the art can select a combination of thickness, yield strength, and elastic modulus of the core and shell materials to provide satisfactory force-to-deflection characteristics of the resulting spring contact elements. Exemplary materials for the core element include gold. Exemplary materials for the coating include nickel and its alloys. The resulting spring contact element is suitably used to effect pressure, or demountable, interconnections between two or more electronic components, including semiconductor devices.

Commonly-owned, co-pending U.S. patent application Ser. No. 08/340,144 filed Nov. 15, 1994 and its corresponding PCT patent application No. PCT/US94/13373 filed Nov. 16, 1994 (WO95/14314, published May 16, 1995), both by Khandros and Mathieu, disclose a number of applications for the aforementioned spring contact elements, and also disclose techniques for fabricating contact pads at the ends of the spring contact elements. For example, a plurality of negative projections or holes, which may be in the form of inverted pyramids ending in apexes, are formed in the surface of a sacrificial layer (substrate). These holes are then filled with a contact structure comprising layers of material such as gold or rhodium and nickel. A flexible elongate element is mounted to the resulting contact element structure and can be overcoated in the manner described hereinabove. In a final step, the sacrificial substrate is removed. The resulting spring contact element has a contact pad having controlled geometry (e.g., a sharp point) at its free end.

Commonly-owned, co-pending U.S. patent application Ser. No. 08/452,255 filed May 26, 1995 and its corresponding PCT Patent Application No. PCT/US95/14909 filed Nov. 13, 1995 (WO96/17278, published Jun. 6, 1996), both by Eldridge, Grube, Khandros and Mathieu, disclose additional techniques and metallurgies for fabricating contact tip structures on sacrificial substrates, as well as techniques for transferring a plurality of spring contact elements mounted thereto, en masse, to terminals of an electronic component.

Commonly-owned, co-pending U.S. Provisional Patent Application No. 60/005,189 filed May 17, 1996 and its corresponding PCT Patent Application No. PCT/US96/08107 filed May 24, 1996 (WO96/37332, published Nov. 28, 1996), both by Eldridge, Khandros and Mathieu, disclose techniques whereby a plurality of contact tip structures are joined to a corresponding plurality of elongate contact elements that are already mounted to an electronic component. Also disclosed are techniques for fabricating "elongate" contact tip structures in the form of cantilevers. The cantilever tip structures can be tapered, between one end thereof and an opposite end thereof. The cantilever tip structures are suitable for mounting to already-existing (i.e., previously fabricated) raised contact elements extending (e.g., free-standing) from corresponding terminals of an electronic component.

Commonly-owned, co-pending U.S. Patent Application No. 60/024,555 filed Aug. 26, 1996, by Eldridge, Khandros and Mathieu, representatively discloses a technique whereby a plurality of elongate tip structures having different lengths than one another can be arranged so that their outer ends are disposed at a greater pitch than their inner ends. The inner, "contact" ends may be collinear with one another, for effecting connections to electronic components having terminals disposed along a line, such as a center line of the component.

As electronic components get increasingly smaller and the spacing between terminals on the electronic components get increasingly tighter or the pitch gets increasingly finer, it becomes increasingly more difficult to fabricate interconnections including spring contact elements suitable for making electrical connection to terminals of an electronic component. Co-pending and commonly-owned U.S. patent application Ser. No. 08/802,054, titled "Microelectronic Contact Structure, and Method of Making Same," discloses a method of making spring contact elements through lithographic techniques. In one embodiment, that application discloses forming a spring contact element (including a spring contact element that is a cantilever beam) on a sacrificial substrate and then transferring and mounting the contact element to a terminal on an electronic component. In that disclosure, the spring contact element is formed in the substrate itself through etching techniques. In co-pending, commonly-owned U.S. patent application, Ser. No. 08/852,152, titled "Microelectronic Spring Contact Elements," spring contact elements are formed on a substrate, including a substrate that is an electronic component, by depositing and patterning a plurality of masking layers to form an opening corresponding to a shape embodied for the spring contact element, depositing conductive material in the opening made by the patterned masking layers, and removing the masking layer to form the free-standing spring contact element.

Co-pending and commonly-owned U.S. patent application, Ser. No. 09/023,859, titled "Microelectronic Contact Structures and Methods of Making Same," describes a contact element having a base end portion (post component), a middle portion (beam component) and a contact end portion (tip component) and methods separately forming each portion and joining the post portion together as desired on an electronic component.

What is needed is a method of fabricating interconnections suitable for present fine-pitch electrical connections that is scalable for future technologies. Also needed are improved methods of making contact elements particularly methods that are repeatable, consistent, and inexpensive.

SUMMARY OF THE INVENTION

A method of forming an interconnection, including a spring contact element, by lithographic techniques. In one embodiment, the method includes applying a masking material over a first portion of a substrate, the masking material having an opening which will define a first portion of a spring structure, depositing a structure material (e.g., conductive material) in the opening, and overfilling the opening with the structure material, removing a portion of the structure material, and removing a first portion of the masking material. In this embodiment, at least a portion of the first portion of the spring structure is freed of masking material. In one aspect of the invention, the method includes planarizing the masking material layer and structure material to remove a portion of the structure material. In another aspect, the spring structure formed includes one of a post portion, a beam portion, and a tip structure portion.

The techniques presented herein may be used to form, for example, contact elements including spring contact elements on substrates including electronic components, such as ceramic- or semiconductor-based components. The contact elements may be formed, in whole or in part, directly on an electronic component or formed separately, as on a sacrificial substrate, and transferred to an electronic component.

The method presented herein provides an improved method for fabricating a contact element. The use of lithographic techniques to fabricate the contact element is well-suited to the fine-pitch, close-tolerance world of microelectronic components. The invention addresses and is particularly well-suited to making interconnections to electronic components having their terminals (e.g., bond pads) disposed at a fine-pitch. As used herein, the term "fine-pitch" refers to electronic components that have their terminals disposed at a spacing of at least less than 5 mils, such as 2.5 mils or 65 $\mu$m. As will be evident from the description that follows, this is preferably achieved by taking advantage of the close tolerances that readily can be realized by using lithographic rather than mechanical techniques to fabricate the contact elements. The incorporation of planarization steps into embodiments of the method of the invention permits multiple contact elements to be fabricated on a substrate with minimal tolerances. Thus, for example, a plurality of spring contact elements having a structure such as described above may be fabricated on or transferred to an electronic component such that each of their tip portions have a similar height and when contacted, for example, by a second electronic component, are displaced a similar distance. In this manner, the contact elements formed by the method of the invention offer more reliable contact height and contact force than prior art structures.

A contact element is also disclosed. In one aspect of the invention, the contact element is a resilient contact element or spring contact element in the form of a cantilever that includes an elongate beam portion extending about the first axis and having a surface that is substantially parallel to a second surface, a post portion coupled to a first surface and extending in a first direction by a second axis, and a tip portion coupled to a second surface and extending in a second direction above the second axis. The post portion is adapted to be coupled to an electronic component, such as to terminals on a ceramic- or a semiconductor-based electronic component. The beam portion forms a cantilever supported at one end to the post portion with the tip portion coupled to a second end.

The contact element of the invention is suitable for making either temporary or permanent electrical connection between terminals of electronic components such as a PCB and a chip under test. The contact element may be fabricated as a permanent element directly on an electronic component, such as a space transformer of a probe card assembly. Alternatively, the contact element of the invention may be separately fabricated on a sacrificial substrate and affixed at its post end, for example, by soldering to on electronic component.

For making temporary connection, the electronic component upon which the contact element is fabricated is brought together with another electronic component so that the tip end of the spring contact element is in pressure contact with a terminal of the other electronic component. The contact element reacts resiliently to maintain contact pressure and any electrical connection between the two components.

For making permanent connections, the electronic component upon which the contact element is fabricated or affixed is brought together with another electronic component, and the tip end of the contact element is joined or bonded, such as by soldering or brazing or with a conductive adhesive, to a terminal of the other electronic component. In one embodiment, the contact element is compliant and may accommodate differential thermal expansion between the two electronic components.

As noted above, the contact element of the invention can be fabricated, along with a plurality of other contact elements, directly on the surface of a device, such as a semiconductor device, or on the surfaces of a plurality of semiconductor devices resident on a semiconductor wafer. In this manner, a plurality of devices resident on a semiconductor wafer can be "readied" for burn-in and/or test prior to being singulated from the semiconductor wafer. Alternatively, the contact element of the invention can be fabricated, typically with a plurality of other contact elements, on a sacrificial substrate and transferred to an electronic component.

Other embodiments, features, and advantages of the invention will become apparent in light of the following description thereof.

BRIEF DESCRIPTION OF THE DRAWINGS

The features, aspects, and advantages of the invention will become more thoroughly apparent from the following detailed description, appended claims, and accompanying drawings in which:

FIG. 10(a) shows a top view of a first exemplary layout of the second conductive material over the substrate in accordance with a first embodiment of the invention.

FIG. 10(b) shows a top view of a second exemplary layout of the second conductive material over the substrate in accordance with a first embodiment of the invention.

FIG. 10(c) shows a top view of a third exemplary layout of the second conductive material over the substrate in accordance with a first embodiment of the invention.

FIG. 10(d) shows a top view of a fourth exemplary layout of the second conductive material over the substrate in accordance with a first embodiment of the invention.

FIG. 10(e) shows a top view of a fifth exemplary layout of the second conductive material over the substrate in accordance with a first embodiment of the invention.

FIG. 10(f) shows a top view of a sixth exemplary layout of the second conductive material over the substrate in accordance with a first embodiment of the invention.

FIG. 11(a) shows a cross-sectional side view of a fourth exemplary layout of the second conductive material over the substrate in accordance with a first embodiment of the invention.

FIG. 11(b) shows a cross-sectional side view of a fifth exemplary layout of the second conductive material over the substrate in accordance with a first embodiment of the invention.

FIG. 17 shows the substrate of FIG. 14 after the further processing step of planarizing a first masking material layer and the first conductive material in accordance with a second embodiment of the invention.

FIG. 18(a) shows the substrate of FIG. 17 after the further processing step of removing the first masking material layer to form a free standing contact element including the tip portion in accordance with one aspect of a second embodiment of the invention.

FIG. 18(b) shows the tip portions of FIG. 18(a) after the further processing step of affixing the fabricated tip portion to the beam portion of a separately fabricated contact element in accordance with one aspect of a second embodiment of the invention.

FIG. 19(a) shows the substrate of FIG. 17 after the further processing step of depositing a seed material over a portion of the planarized surface in accordance with a second aspect of a second embodiment of the invention.

FIG. 19(b) shows the substrate of FIG. 17 after the further processing step of patterning a second masking material layer over the substrate having an opening to the first conductive material, the opening extending laterally and/or transversely over the substrate from the first conductive material in accordance with a second aspect of a second embodiment of the invention.

FIG. 19(c) shows the substrate of FIG. 17 after the further processing step of depositing a conductive material in the opening of the second masking material layer in accordance with a second aspect of a second embodiment of the invention.

DETAILED DESCRIPTION OF THE INVENTION

The invention relates to a method of forming an interconnection element, including a contact element, by lithographic techniques. The invention offers an improved technique for fabricating contact elements, particularly for use in interconnecting micro-electronic components. The invention also relates to a contact element. According to one aspect of the invention, the limits on size and pitch of the contact element of the invention or formed by the method of the invention are a factor of photolithographic techniques. By incorporating planarization steps as part of the photolithographic techniques, the invention contemplates the consistent formation of contact elements, including cantilever spring contact elements, of similar size and mechanical (e.g., displacement) properties.

Suitable electronic components include, but are not limited to, an active semiconductor device, a memory chip, a portion of a semiconductor wafer, space transformer, a probe card, a chip carrier, and a socket. The electronic component may be an active device or a passive device that supports one or more electronic connections. Independent fabrication also avoids the exposure of the electronic component to the process conditions associated with forming the contact-element.

The contact element or elements of the invention may be fabricated on or independent of the electronic component to which it is or they are joined. In the case of independent fabrication, the invention permits the contact element or elements to be fabricated with a shape, size, and metallurgy that are not limited by the materials and layout considerations associated with the manufacture of the electronic component.

Disposed on an electronic component such as a space transformer of a probe card assembly, the contact elements of the invention are designed to accommodate contacts or terminals of electronic components having minimal pitch or spacing tolerances. The contact elements may also adopt alternating orientation (e.g., left-right-left-right) so as to achieve a greater pitch between their post portion than at the tip portion. In another embodiment, the contact elements may adopt alternating lengths (e.g., short-long-short-long) so as to achieve a greater pitch between the post portion than at the tip portion of adjacent contact elements. Similarly, alternating contact elements can be fabricated to have a greater pitch at their tip portions than their post portions. In summary, the contact elements, whether fabricated on or independent of the electronic component to which they are joined may adopt a variety of orientations to accommodate various configurations associated with the electronic components to which they contact.

Figure 1A:
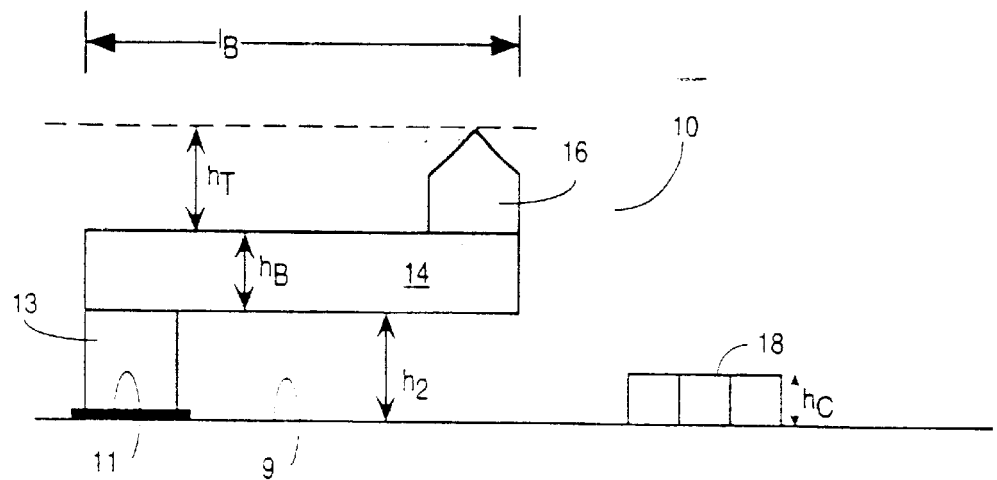
FIG. 1(a) is a cross-sectional side view of an example of a contact element of the invention coupled to an electronic component.
Figure 1B:
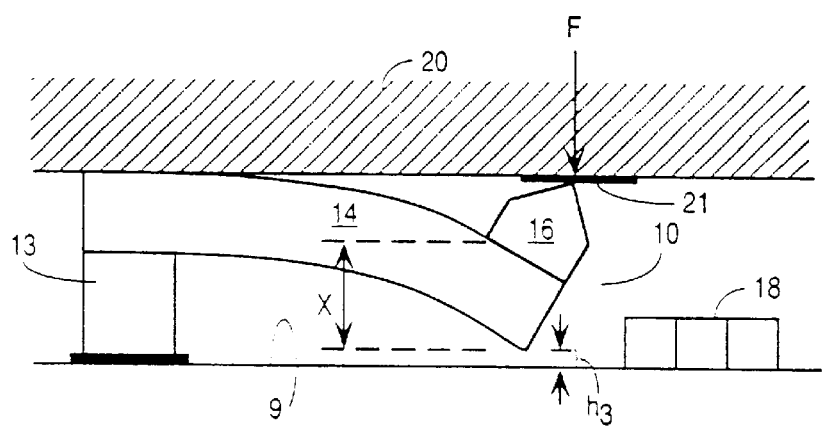
FIG. 1(b) shows the contact element of FIG. 1(a) in contact with a second electronic component in accordance with an embodiment of the invention.

FIGS. 1a and 1b illustrate one embodiment of a contact element of the invention. FIG. 1a shows contact element 10 comprising post portion 13, beam portion 14, and tip portion 16. Post portion 13 is disposed on terminal 11 of electronic component 9. Post portion 13 has a height of $h_2$. Beam portion 14 is coupled at one end to post portion 13. Beam portion 14 as a height $h_B$, and length $l_B$. At the other end of beam portion 14 and coupled to a side opposite post portion 13 is tip portion 16. Tip portion has a height $h_1$.

FIG. 1b shows contact element 10 under load such as when accommodating a substrate under test. In this case, substrate 20 having terminal 21 is brought into contact with contact element 10 and a downward force, F, is applied at tip portion 16 of contact element 10 to deflect contact element 10 downward. In this embodiment, the length of beam portion 16, $L_B$, determines the maximum overtravel of contact element 10. A suitable overtravel is, for example, 3–8 mils. To accommodate the suitable overtravel, the height of post portion 13, $h_2$, should be greater than the height of tip portion 16, $h_1$. In such instance, the greater height difference will minimize the possible "bottoming-out" of contact element 10 against the surface of electronic component 9. FIG. 1(b) shows deflected contact element 10 separated at its tip portion end by a height, $h_3$. The height of post portion 13 may also be configured to be greater than the height of a capacitor or other structure that might be coupled to the surface of electronic component 9. FIG. 1(a) shows capacitor 18 having a height, $h_c$, that is less than the height of post portion 13, $h_2$.

FIG. 1(b) also shows that the height of post portion 13 and the height of beam portion 14 ($h_2+h_B$) further determines the overtravel of contact element 10 when the force, F, is applied by substrate 20. A "bottoming-out" of substrate 20 against the post portion end of beam portion 14 limits the maximum compression that may be applied to contact element 10 and serves, in one manner, to limit damage to contact element 10.

Under load such when contacting substrate 20, beam portion 14 deflects by an amount represented in FIG. 1(b) by x. A spring constant may be calculated for this deflection as followed:

$$k=F/x.$$

In one embodiment, the spring constant k is proportional to the thickness of beam portion 14:

$$k \propto h_B^3.$$

Thus, based on the above relationship, controlling the thickness of beam portion 14 provides tight control of the spring constant. Controlling the spring constant for each contact element of an electronic component, such as the space transformer of a probe card assembly, allows a consistent contact force to be applied to each terminal, such a terminal 21 of a substrate under test (such as substrate 20).

FIGS. 2–13(c) illustrate a method of forming an interconnection that is a contact element on an electronic component in accordance with a first embodiment of the invention. A contact element that is a cantilever having a post portion, a beam portion, and a tip portion will be formed in this embodiment. It is to be appreciated that at a given time, a number of contact elements can be formed on a substrate. The method described below focuses on the formation of a single contact element. It is to be understood that the discussion applies equally well to the fabrication of a number of contact elements on a substrate, such as an electronic component at a given time. Typically, each of the contact elements fabricated on a substrate will have substantially similar characteristics (i.e., dimensions, shape, etc.). It is also appreciated, however, that the characteristics of the contact elements of a substrate can be individually controlled and determined for given application requirements.

Figure 2:
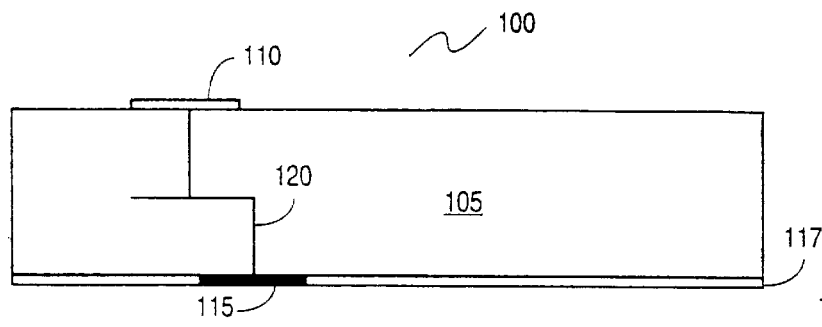
FIG. 2 is a cross-sectional side view of a substrate having electrical contacts or terminals formed on two surfaces thereof and connected in accordance with a first embodiment of the invention.

FIG. 2 shows a cross-sectional side view of electronic component 100. Electronic component 100 is, for example, a space transformer of a probe card assembly or an integrated circuit. Electronic component 100 includes, for example, semiconductor- or ceramic-based substrate 105 having contacts or terminals 110 and 115 on opposing surfaces of substrate 105. In the case of a commercially available ceramic-based electronic component 100, for example, electronic component 100 contains terminals 110 and 115 on opposing surfaces of substrate 105. Terminals 110 and 115 are connected, for example, through conductive circuit 120 running through electronic component 100 such as, for example, a molybdenum or tungsten and molybdenum/tungsten circuit 120. Terminals 110 and 115 on substrate 105 are, for example, copper (Cu), nickel (Ni), and gold (Au) terminals that may be suitable for connecting to a contact element formed through the deposition of a conductive material by, for example, soldering. In one example, the copper facilitates the electroplating process and is the upper layer. The nickel acts as a barrier between the gold and the copper. FIG. 2 also shows shorting layer 117 on the underside surface of substrate 105. Shorting layer 117, such as for example, a titanium-tungsten (Ti—W) layer, serves, in this example, to short terminal 115 during the fabrication of contact elements on substrate 105. As will become evident from the description that follows, this shorting feature of shorting layer 117 can advantageously be employed to establish an appropriate potential for an electrolytic process (e.g., an electroplating process) for fabricating contact elements on substrate 105. Shorting layer 117 may be removed, for example, by a sputter or chemical etch process, once contact elements are formed on the opposing surface of substrate 105.

In the application where contact elements are to be formed by plating and there is no through-circuit extending through the substrates allowing a shorting layer to be formed on a backside of the substrate, a conductive layer such as a seed layer is generally needed to accomplish subsequent plating. Thus, in a first step of such a process, a conductive layer is deposited over the surface of substrate 105. A suitable conductive layer is, for example, a titanium, tungsten, or a titanium-tungsten (Ti—W) layer, conformally deposited over the surface of the substrate (105). In this manner, the "blanket" layer deposition will electrically short together all exposed terminals (110) on the surface of the substrate (105).

Figure 3:
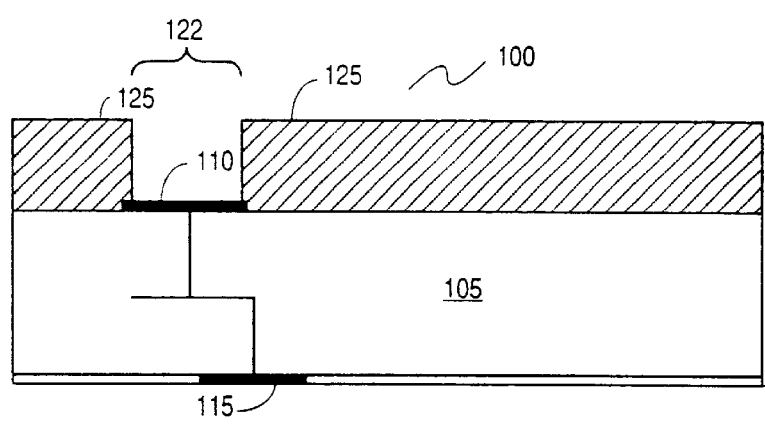
FIG. 3 shows the substrate of FIG. 2 after the further processing step of depositing a first masking material layer over the substrate and exposing terminals on a surface thereof through an opening in accordance with a first embodiment of the invention.

FIG. 3 shows electronic component 100 of FIG. 2 after the further process step of depositing first masking material layer 125 over substrate 105. In one preferred embodiment, first masking material layer 125 is a photoresist that is spin coated on the surface of substrate 105 and patterned as known in the art.

As shown in FIG. 3, first masking material 125 is deposited and patterned to include opening 122 extending through first masking material layer 125. Opening 122 may be located at a position that is directly over a portion of terminal 110 or, in some cases, may be located at a position that is remote from terminal 110. By locating openings (122) at a position remote from terminals (110), a plurality of contact elements can be fabricated on an electronic component with a layout that differs from that of the terminals of the electronic component. One configuration, for example, is to position openings (122) so that contact elements built thereon will have there tip portions arranged in an area array comparable to a ball grid array. The openings can be connected to terminals on the electronic component arranged, for example, as peripheral pads. It may be advantageous to make the contact elements substantially identical without displacement from the terminals (110). In this instance, it is useful to locate openings (122) in an area array corresponding to the array of the tip portions of the contact elements.

The side walls of first masking material layer 125 about opening 122 may be tapered so that opening 122 may be larger at the surface of first masking material layer 125 than at conductive layer 112, i.e., a positive taper. Suitable taper angles include, but are not limited to, 60°–90°. One having ordinary skill in the art will readily understand how to form the tapered opening in first masking material layer 125. It is to be appreciated that opening 122 can be formed in any suitable manner and may be stepped like an inverted, stepped, truncated pyramid.

First masking material layer 125 is deposited to a thickness of the desired height of the post portion of a contact element, taken into consideration subsequent shaping (e.g., planarization) of the material that is to be the post portion. In other words, the thickness of first masking material layer 125, that will primarily determine the distance that the main body portion (i.e., beam portion and tip portion) is spaced away from the surface of the electronic component. In the example of a contact element where resiliency is desired, for example, the dimensions of the post portion, the beam portion, and the tip portion may be coordinated to maximize the contact force of the tip portion with, for example, a terminal of an electronic component, and minimize potential "bottoming out" of the deflected beam portion. Such coordination is discussed in detail above with reference to FIGS. 1(a)–1(b) and the accompanying test. For current technologies, a suitable height of first masking material layer 125 will be approximately 5–30 mils.

FIG. 3 shows first masking material layer 125 having opening 122 adjacent terminal 110. It is to be appreciated that opening 122 may have a variety of shapes including, but not limited to, substantially rectangular, cylindrical, or pyramidal (inverted) or conical such as by having a wider opening at the exposed surface at conductive layer 112.

Figure 4:
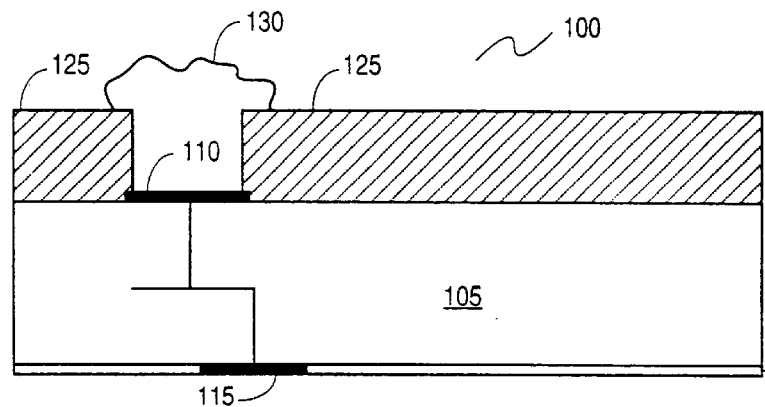
FIG. 4 shows the substrate of FIG. 2 after the further processing step of depositing a first conductive material in the opening in the first masking material layer to a terminal on the substrate in accordance with a first embodiment of the invention.

Next, as shown in FIG. 4, first conductive material 130 is deposited in opening 122 in first masking material layer 125 to terminal 110. Suitable deposition techniques, include, but are not limited to, electroplating, chemical vapor deposition (CVD), sputter deposition, and electroless plating. In one example, first conductive material 130 is deposited through an electroplating process. First conductive material 130 is, in this example, an electroplate alloy such as copper or a nickel alloy, such as nickel-cobalt. First, conductive material 130 is typically applied in the form of a commercially available electroplate solution or bath. Next, a current is applied between terminal 110 and an anode of an electroplating cell (not shown). Negative charge build-up on terminal 110 causes metal ions from the electroplating solution to be reduced to a metallic state, and hence first conductive material 130, such as, for example, nickel-cobalt, is deposited on terminal 110. In this example, first conductive material 130 is deposited to a thickness of at least the thickness of first masking material layer 125, and preferably deposited to a thickness greater than first masking material layer 125 (overplating).

Figure 5:
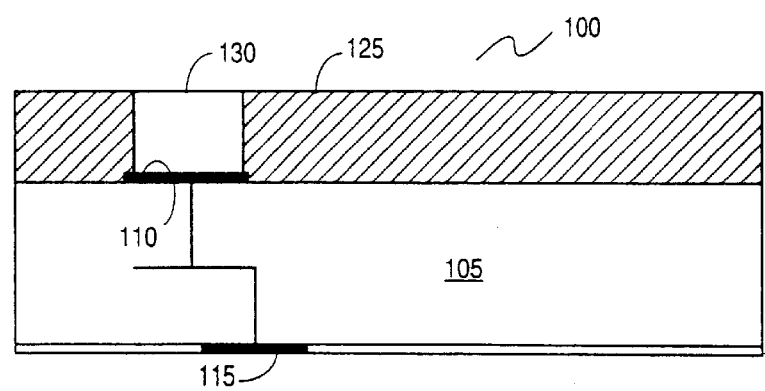
FIG. 5 shows the substrate of FIG. 2 after the further processing step of planarizing the first masking material layer and the first conductive material in accordance with a first embodiment of the invention.

FIG. 5 shows substrate 100 after the further processing step of planarizing first conductive material 130 and first masking material layer 125 in accordance with an embodiment of the invention. The planarization is accomplished, for example, by a grinding procedure or a chemical-mechanical polish with a suitable slurry. A suitable slurry for a chemical-mechanical polish is, for example, a silicon dioxide, aluminum oxide, and cesium oxide in a pH-adjusted slurry.

The planarizing step of FIG. 5 defines the height of the post portion of a contact element coupled to the substrate 105. The planarization step provides dimensional control of the contact element by establishing a known height for the post portion of the contact element. As noted, the height of the post portion plays an important role in determining the contact force that the contact element will deliver to, for example, a terminal of an electronic component. The height of the post portion also plays a role in minimizing the "bottoming out" of the deflected beam portion. Thus, the ability to control the height of the post portion of the contact element is very advantageous.

The planarization step of the invention should also proceed to a suitable stopping point, such as, for example, a flatness of about 1 micron per centimeter (or 0.1 mils per inch). The tolerance among a plurality of contact elements on a substrate will vary with the application and may be determined by one having skill in the art. Preferred tolerances of less than 5 microns per centimeter and preferably less than 2 microns per centimeter are contemplated.

Once the post portion of a contact element is formed, FIG. 5 shows substrate 105 after the further processing step of rendering an area on the surface of first masking material layer 125 conductive such that the area can act as a suitable electrode for an electroplating process. In one embodiment, a portion of an area over first masking material layer 125 is covered with a thin adhesion/seed layer of conductive metal or metal alloy 135 such as a titanium, a titanium-tungsten alloy layer, or a titanium/gold bilayer. Seed layer 135 may be deposited via a blanket deposition, such as a sputter deposition. For an electroplated nickel-cobalt layer, for example, a seed layer having a thickness of about 5000 angstroms is suitably deposited by, for example, a blanket sputter deposition process over the surface of first masking material 125. Alternatively, seed layer 135 maybe deposited as a plurality of "traces," each trace corresponding to an area over first masking material layer 125 where the beam portion of the contact element is to be formed to serve, in one manner, as an electroform whereupon the beam portion can be fabricated.

In yet another embodiment, a stencil (shadow mask) may be deposited over the surface of first masking material layer 125. The stencil typically will have a plurality of openings extending laterally from an area above corresponding post portions (indicated by first conductive material 130) to define areas form beam portions of the contact elements. The stencil may suitably be a thin (e.g., about 2 mils thick) foil of stainless steel which may be punched or etched to have openings. The stencil can be any suitable material having any suitable thickness that will permit seed layer 135 to be deposited onto first masking material layer 125 in a pattern of conductive traces corresponding to the shapes of the openings in the stencil. With the stencil in place, seed layer 135 is deposited, such as by sputtering, onto the exposed surface of first masking material layer 125. The stencil may then be removed.

The selecting of the material for first masking material layer 125 and process for deposition of seed layer 135 should be considered together. The masking material needs to be stable in the environment of the deposition method. For example, a typical positive photoresist material contains some solvent that may outgas under high vacuum condition. It is preferable in this instance to modify the material, for example, by baking or exposure to light in order to cross-link or otherwise rigidify the masking material. Polyimide is a useful masking material and will tolerate a sputtering environment without significant degradation. Deposition also can be by means of chemical vapor deposition (CVD) or e-beam processes. This require less vacuum than the sputtering. For these processes, traditional Novolac photoresist resins can be used, possibly with some moderate cross-linking. Another consideration is that any modification to the masking material to make it stable under vacuum may make it more difficult to remove later in the process. A suitable material and process can be selected by one skilled in the art. One particular process is to use Novolac photoresist, patterned as described above, then partially cross-linked by heating. Deposition of seed layer 135 is accomplished using CVD.

Figure 6:
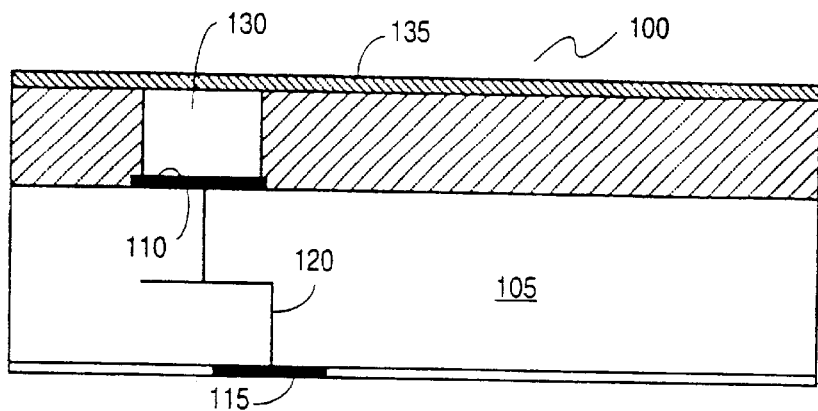
FIG. 6 shows the substrate of FIG. 2 after the further processing step of depositing a seed material over a portion of the planarized surface in accordance with a first embodiment of the invention.
Figure 7:
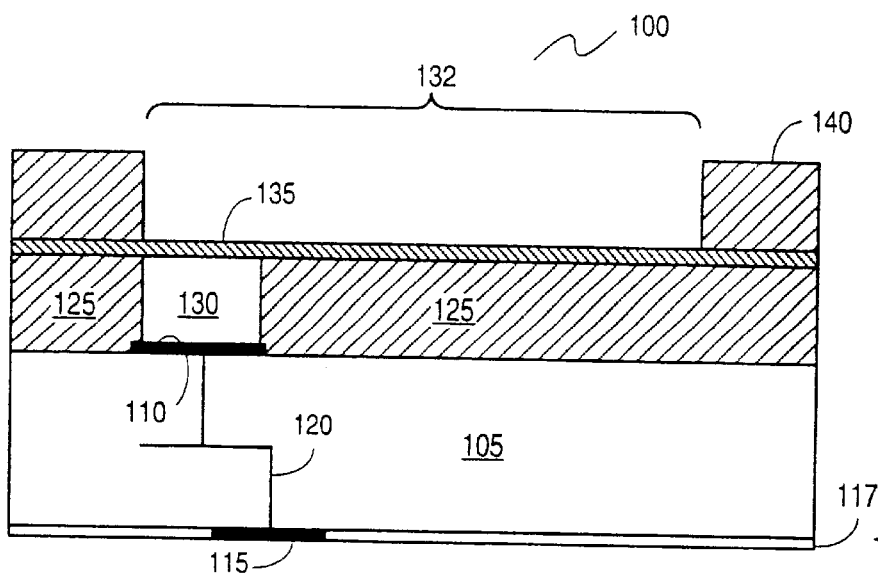
FIG. 7 shows the substrate of FIG. 2 after the further processing step of patterning a second masking material layer over the substrate having an opening to the first conductive material, the opening extending laterally and/or transversely over the substrate from the first conductive material in accordance with a first embodiment of the invention.

Next, as shown in FIG. 6, an area over substrate 100 is covered with second masking material layer 140, again such as photoresist bearing in mind the considerations of using multiple masking materials in the presence of conductive layers. Second masking material layer 140 is patterned to expose area 132 over substrate 100 that defines an area for a beam portion of the contact element.

Figure 8:
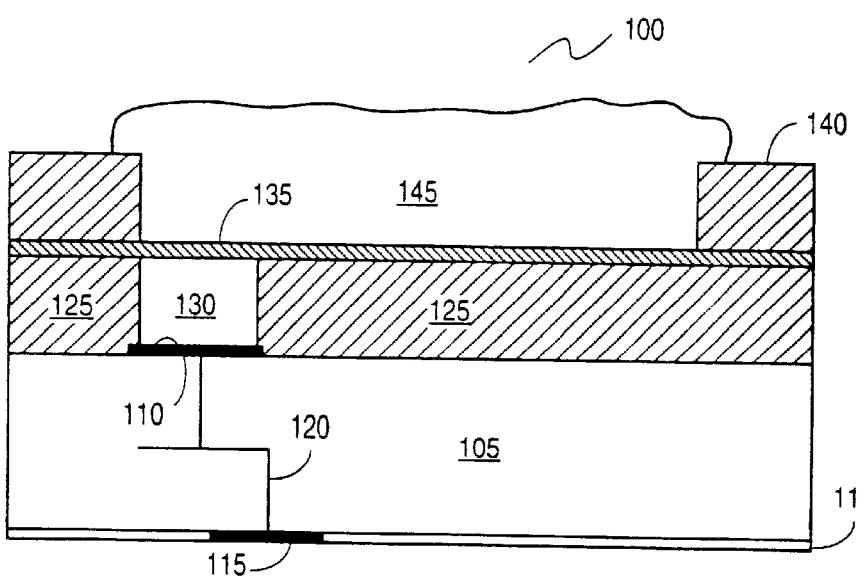
FIG. 8 shows the substrate of FIG. 2 after the further processing step of depositing a second conductive material layer in the opening of the second masking material layer in accordance with a first embodiment of the invention.

FIG. 8 shows substrate 100 after the further processing step of depositing second conductive material 145 over the top surface of the substrate. In one embodiment, second conductive material 145 is deposited through an electroplating process with an electroplate alloy such as nickel-cobalt. In FIG. 8, second conductive material 145 is deposited to a thickness greater than the thickness of second masking material layer 140. Second conductive material 145 serves as the beam portion of the contact element. It is to be appreciated that amount deposited and thus the thickness of second conductive material 145 will depend, in part, on the desired thickness of the beam portion.

Figure 9:
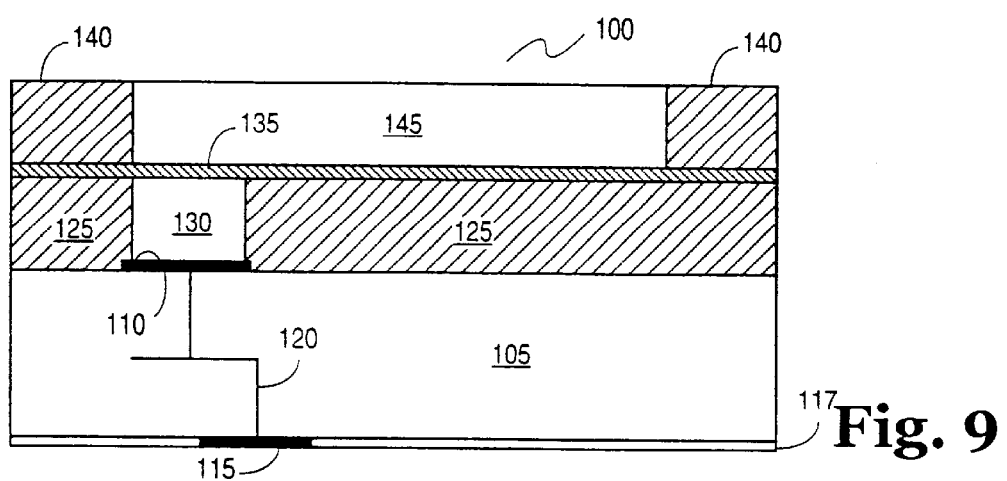
FIG. 9 shows the substrate of FIG. 2 after the further processing step of planarizing the second masking material layer and the second conductive material in accordance with a first embodiment of the invention.

As shown in FIG. 9, after the deposition of second conductive material 145 over substrate 105, second conductive material 145 and second masking material layer 140 are planarized by way of a grinding process of a chemical-mechanical polish such as described above to form a beam portion of the contact element on substrate 105. As noted above, in the case of a cantilever spring contact element, the thickness of the beam portion is directly proportional to the spring constant ($k \propto h_B^3$). Planarization of second conductive material 145 and second masking material 140 provides tight control of the thickness of the beam portion of the contact element (i.e., control of the thickness of second conductive material 145), thus allowing a determinable and consistent contact force to be applied by each contact element.

The above-described process of patterning a masking material layer, depositing a seed layer, depositing a conductive material, and planarizing, may be repeated numerous times to build complex structures. Some examples will be discussed in detail later in this description.

FIGS. 10(*a*)–11(*b*) show various representative, useful configurations for a beam portion of a contact element formed on substrate 105. It is to be appreciated that there may be various other configurations suitable for particular applications for the contact elements of the invention. FIGS. 10(*a*)–11(*b*) are to be viewed as representative of these various configurations.

FIGS. 10(*a*)–10(*f*) show top planar views of various configurations of the beam portion of a contact element formed on substrate 105 in an xy plane. FIG. 10(*a*) shows second conductive material 145*a* patterned into a beam portion over first conductive material 130 and extending laterally from an area over first conductive material 130 in a substantially rectangular fashion. FIG. 10(*b*) shows a second configuration wherein second conductive material 145*b* is configured to have a taper in the y-direction ("y-taper") as second conductive material 145*c* laterally extends (in an x-direction) from an area over the surface of first conductive material 130. This configuration more evenly distributes the stress on the contact element by reducing the size of the extremity of the beam portion (e.g., the cantilever) of the contact element. In FIG. 10(*b*), a laterally extending portion of second conductive material 145*b* is depicted with substantially linear edges. It is to be appreciated that the edges need not be substantially linear but may be curved such as, for example, in a concave manner.

FIG. 10(c) shows a third configuration of the beam portion of a contact element in accordance with a first embodiment of the invention. In this configuration, second conductive material 145c extends laterally (in an x-direction) and transversely (in a y-direction) from post portion 130 to form a curved beam portion. FIGS. 10(d) and 10(e) show a fourth and a fifth configuration, respectively, where beam portion (of second conductive material 145d and 145e, respectively) extends laterally and transversely. The laterally and transversely extending beam portions may be desirous, for example, when fabricating contact elements to particularly minimize the pitch between adjacent contact elements. FIG. 10(f) shows a sixth configuration of a beam portion wherein second conductive material 145f partially encircles post portion 130.

FIGS. 11(a) and 11(b) show fourth and fifth configurations of the beam portion of the contact element in accordance with a first embodiment of the invention in an xz plane. FIG. 11(a) shows second conductive material 145g having a planar upper surface and a concave lower surface. FIG. 11(b) shows second conductive material 145h having a planar lower surface and a linearly decreasing upper surface toward the extremity. Conductive materials 145g and 145h can be formed in this manner in a number of ways, including varying the light source to shape the underlying and adjacent photoresist that forms the masking material and electroplating in the presence of a non-conductive mask to distribute the electroplated material where desired.

Figure 12A:
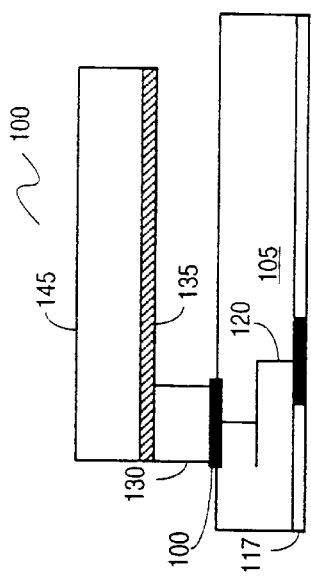
FIG. 12(a) shows the substrate of FIG. 2 after the further processing step of removing the first masking material layer and the second masking material layer to form a free-standing contact element including a post portion and a beam portion in accordance with one aspect of a first embodiment of the invention.
Figure 12B:
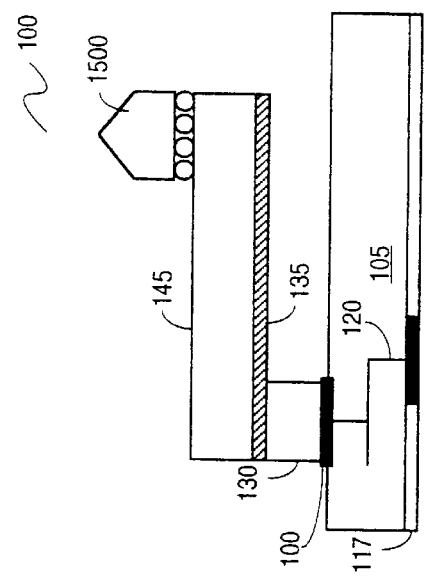
FIG. 12(b) shows the substrate of FIG. 12(a) after the further processing step of affixing a separately fabricated tip portion to the beam portion of the contact element in accordance with one aspect of a first embodiment of the invention.

FIGS. 12(a) and 12(b) show one aspect of the first embodiment of the invention. In this aspect, the fabrication of the components for the contact element on electronic component 105 by lithographic techniques is substantially complete with the formation of a spring contact element having a post portion of first conductive element 130 and a beam portion of second conductive material 145. FIG. 12(a) shows substrate 100 after the further processing step of removing first masking material layer 125 and second masking material layer 140. In the example where a first masking material layer 125 and second masking material layer 140 are photoresist, a step of removing first masking material layer 125 and second masking material layer 140 may be accomplished with an oxygen plasma etch (e.g., oxygen ashing). Other methods of removing the masking material layers include, but are not limited to, laser ablation and wet chemical etching. An additional etch may be required to remove excess or undesired portions of seed layer 135. However, because seed layer 135 is typically thin (e.g., about 5000 Å), any excess or undesired seed layer material is typically removed with the removal of the masking layer material. In this manner, FIG. 12(a) shows a free standing contact element affixed to electronic component 105 at terminal 110 and having a post portion represented by first conductive material 130 and a laterally and/or transversely extending beam portion represented by second conductive material 145. A structure such as this may serve as a useful contact structure, for example, by coating some portion of the beam portion with a suitable contact material.

In one preferred example, a separately formed tip portion 1500 may be affixed to the distal end of the beam portion, for example, by brazing, soldering, welding (e.g., spot welding), conductive epoxy, tacking, etc. to form the contact element shown in FIG. 12(b). One method of forming a tip portion is described herein with reference to FIGS. 14–18(b) and the accompanying text. Other methods of forming and transferring tip portions are described in detail in commonly-owned U.S. Pat. No. 5,829,128 and PCT Application No. PCT/US97/08606, published Nov. 20, 1997 as WO97/43653. In PCT Application No. PCT/US97/08606, for example, a method is described for fabricating a plurality of contact tip portions having a relatively precise positional relationship with one another on a sacrificial substrate such as a silicon wafer. The contact tip portions are readily fabricated on a sacrificial substrate to extremely close tolerances given conventional semiconductor processing techniques (e.g., photolithography, deposition, etc.), to prescribe a spatial relationship with one another. So long as the contact tip structures remain resident on the sacrificial substrate, the tolerances in spatial relationship are preserved. The invention described in that co-pending application facilitates the construction of contact elements by joining a plurality of contact tip portions to a corresponding plurality of interconnection elements (e.g., beam portions of contact elements). The tip portions are joined to contact elements by bringing the tip portions, still resident on the sacrificial substrate, in contact with the contact element and joined, for example, by brazing and then removing the sacrificial substrate. These techniques can be used to transfer the tip portion to the structure of FIG. 12(a).

Figure 13A:
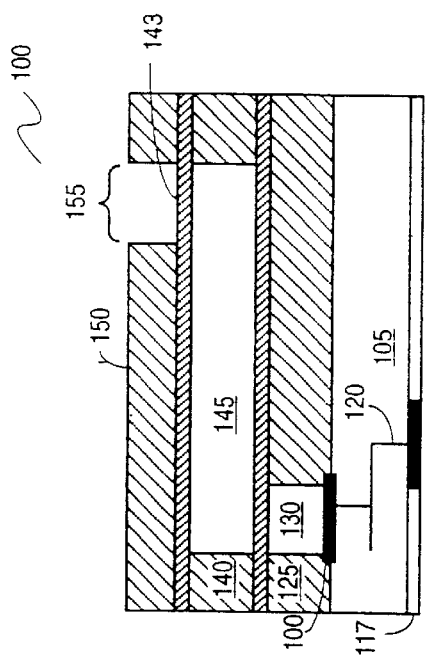
FIG. 13(a) shows the substrate of FIG. 2 including the exemplary layout of the second conductive material as in FIG. 8 and after the further processing step of depositing a third masking material layer over the substrate and forming an opening to the second conductive material layer in accordance with a second aspect of a first embodiment of the invention.
Figure 13B:
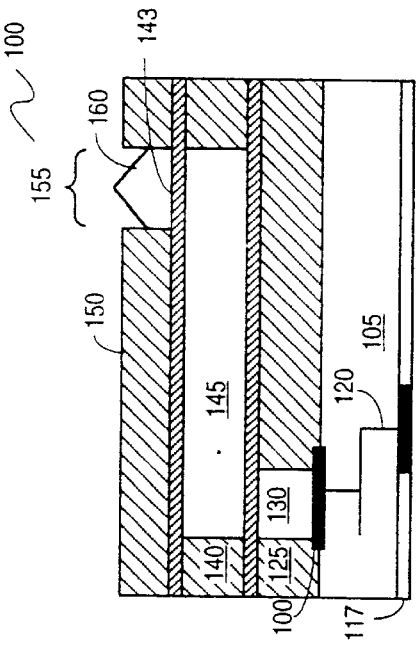
FIG. 13(b) shows the substrate of FIG. 13(a) after the further processing step of depositing a third conductive material in the opening in the third masking material layer to form a tip portion of a contact element in accordance with a second aspect of a first embodiment of the invention.
Figure 13C:
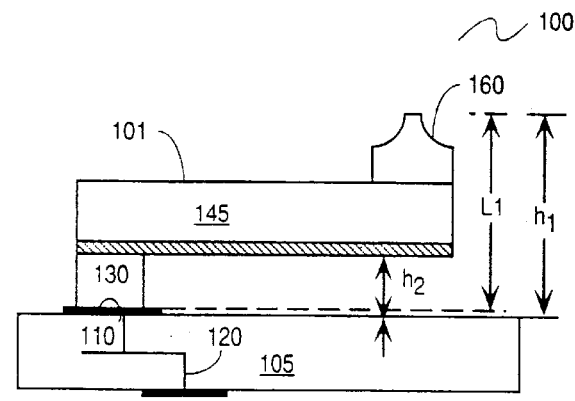
FIG. 13(c) shows the substrate of FIG. 13(b) after the further processing step of removing the third masking material layer to form a free-standing contact element including a post portion, a beam portion, and a tip portion in accordance with a second aspect of a first embodiment of the invention.

FIGS. 13(a)–13(c) show a second aspect of the first embodiment of the invention wherein the tip portion of the contact element is fabricated on substrate 105 using further lithographic techniques. FIG. 13(a) shows electronic component 100 after the further processing step of depositing third masking material layer 150 over substrate 105 and patterning opening 155 to second conductive material 145 at the distal end of second conductive material 145 (i.e., distal relative to the location of first conductive material 130). Opening 155 has a diameter suitable for the formation of a desired tip portion of the contact element. A suitable opening is, for example, 6 mils in diameter. Rectangular and/or sloped openings may also be incorporated.

FIG. 13(b) shows electronic component 100 after the further processing step of forming a tip portion of the contact element in opening 155 of third masking material layer 150. The tip portion of the spring contact element is made of third conductive material 160. In one embodiment, third conductive material 160 is a multilayer material formed through an electroplating process. For example, third conductive material 160 may consist of a layer of gold of approximately 1 mil, followed by an optional thin layer of a noble metal such as rhodium, followed by a layer of nickel having a thickness of approximately 1.0–1.5 mils.

It is desirable, in certain applications, to include an outer contact layer for ultimate contact with a second electronic component. This may be in the form of a layer that is deposited at the end of constructing a tip structure. This layer is decidedly optional, depending on applications and design criteria. It may be plated on a finished structure such as the tip in FIG. 13(b).

When desired, a layer of contact metal can be plated as a final layer on a contact structure. Palladium (Pd), palladium-cobalt (PdCo), gold (Au) (soft or hard gold) and rhodium (Rh) are particularly useful. These materials, their properties, and deposition methods are known in the art of contact structures for electronics. A particularly preferred material is an alloy of palladium and cobalt (PdCo). A useful thickness may be about 0 to about 200 microinches (0 to 5 microns) but more can be used—even tens of microns or more. In one alternative design, the entire contact structure layer is made of this material. In a particularly preferred embodiment, some portion of the final contact structure layer is made of this material.

The upper or top surface of third conductive material 160 may be shaped such as shown in FIG. 13(b), such as pointed to yield, for example, an inverted pyramidal feature, by a controlled etch of third conductive material 160.

FIG. 13(c) shows electronic component 100 after the further processing step of removing first masking material layer 125, second masking material layer 140, and third masking material layer 150 to yield a free standing contact element on substrate 105. In the embodiment where first masking material layer 125, second masking material layer 140, and third masking material layer 150 are each a photoresist, the masking material layers may be removed through an oxygen ashing process as noted above. Other techniques, including but not limited to, laser ablation and wet chemical etching may also be applied to remove the masking material layers. FIG. 13(c) shows free standing contact element 101 overlying substrate 105 and affixed to terminal 110 of substrate 105. At this time, any shorting layer (e.g., shorting layer 117) may be removed.

The above description presented the first embodiment of the process of the invention whereby a contact element is fabricated directly on an electronic component such as a space transformer of a probe card assembly. A particularly useful substrate for an electronic component is a ceramic-based substrate. In one aspect of the invention, a ceramic-based electronic component is chosen, for example, having terminals to accommodate corresponding contact elements, formed by a process such as described, to test, for example, multiple integrated circuit dice or chips at a time. Such an electronic component can easily have 1500 or more contacts (terminals). As noted above, the same method described to form a single contact element may be used to form the additional contact elements.

A second useful substrate for an electronic component is a semiconductor substrate. Metal substrates may also be utilized. One advantage of a semiconductor-based technique is that it offers, in the case of, for example, "chip-size" electronic components, the ability to fabricate more electronic components having contact elements at a single time than a ceramic-based electronic component which conceivably can be limited to forming contact elements on the single ceramic-based electronic component.

As is evident in FIG. 13(c), a plurality of contact elements such as elongate or cantilever contact element 101 can be affixed to an electronic component having a plurality of terminals on a surface thereof. In this aspect of the embodiment, each contact element 101 has post portion 130, beam portion 145, and tip portion 160 opposite post portion 130, and is affixed at its post portion to a corresponding terminal of electronic component 105. Tip portion 160 of each contact element extends above the surface of electronic component 105 through a position that is laterally and/or transversely offset from post portion 130 forming a freestanding, cantilever structure.

In one embodiment, contact element 101 is resilient and is a spring contact element. Contact element 101 has an "effective" height of "L1," this being the distance between the highest portion of tip portion 160 and the inward most position where post portion 130 is affixed to electronic component 105. The actual height "$h_1$" represents the distance that the highest portion of tip portion 160 extends from electronic component 105. The distance between the underside of beam portion 145 and the surface of electronic component 105 is represented by "$h_2$" and represents the distance that contact element 101 can deflect in response to compressive forces applied at tip portion 160 thereof.

Figure 14:
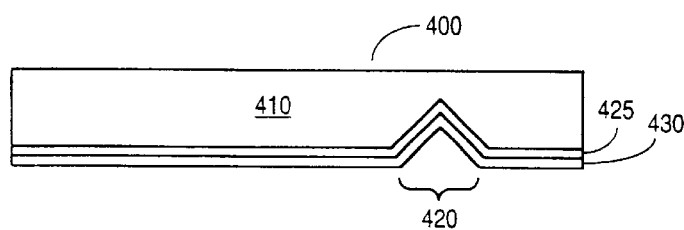
FIG. 14 is a cross-sectional side view of a substrate having a triangularly shaped feature formed in a surface of the substrate with conductive layers overlying a surface of the substrate and the triangularly-shaped feature in accordance with a second embodiment of the invention.

FIGS. 14–21(c) illustrate a second embodiment of fabricating a contact element according to the invention. FIG. 14 shows structure 400 including substrate 410 that is a sacrificial substrate such as, for example, a semiconductor substrate. For illustration purposes, substrate 410 is oriented to show a finished contact element having the same orientation as the contact element(s) represented in FIGS. 1(a)–13(c).

Formed in a surface of substrate 410 is a pyramidly-shaped feature. Methods for forming a pyramidly-shaped feature are described in detail in commonly-owned pending PCT Application No. PCT/US97/08606, published Nov. 20, 1997 as WO97/43653. In PCT Application No. PCT/US97/08606, a method is described whereby a pyramidly-shaped feature is formed by the patterning of a masking material having a preferably square opening measuring approximately of 1–4 mils on a side over a semiconductor substrate. Next, the substrate is etched to form the pyramidly-shaped depression. In the case of certain silicon semiconductor substrates, silicon will tend to be self-limiting as the etching proceeds along the crystal plane, such as at approximately 54.74° for silicon. In other words, the depression will extend to a depth that is dictated by the size of the mask opening and the nature of the substrate. For example, with square openings of 2.5 mils per side, the depth of the depression will be approximately 2 mils.

Other methods of forming pyramidly-shaped features are described in commonly-owned U.S. Pat. No. 5,809,128 and co-pending and commonly-owned U.S. patent application Ser. No. 08/802,054, titled "*Microelectronic Contact Structure, and Method of Making Same.*"

Overlying the surface of substrate 410 is release layer 425. Release layer 425 is, for example, a metal such as aluminum, deposited to a thickness of approximately 5000 angstroms (Å) using conventional deposition techniques. Overlying release layer 425 on the surface of substrate 410 is seed layer 430. Seed layer 430 is, for example, copper that facilitates a copper electroplating process. In one embodiment, seed layer 430 of copper is deposited to a thickness of approximately 5000 Å using conventional deposition techniques.

Figure 15:
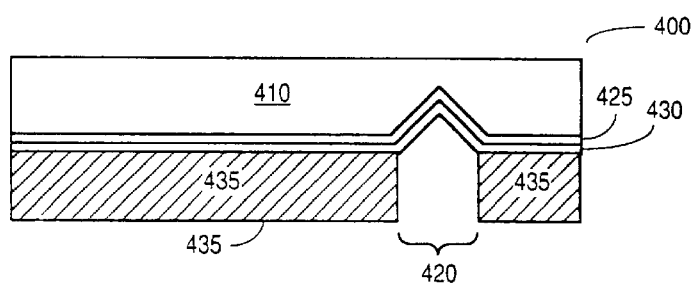
FIG. 15 shows the substrate of FIG. 14 after the further processing step of depositing a first masking material layer over a surface of the substrate and exposing the triangularly-shaped feature through an opening in the first masking material layer in accordance with a second embodiment of the invention.

FIG. 15 shows structure 400 after the further processing step of depositing and patterning first masking material layer 435 over substrate 410. First masking material layer 435 is, for example, a photoresist such as used in the embodiment described above with reference to FIGS. 2–13(d) and the accompanying text deposited to a thickness of the desired height of the tip portion of a contact element taking into consideration the possibility of planarizing a portion of first masking material layer 435 with tip portion material. First masking material layer 435 is patterned to have an opening over feature 420.

Figure 16:
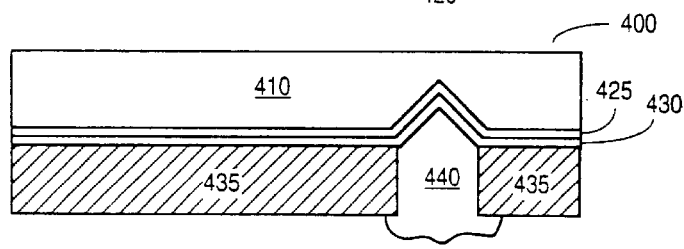
FIG. 16 shows the substrate of FIG. 14 after the further processing step of depositing a first conductive material in the opening in the first masking material layer in accordance with a second embodiment of the invention.

Next, as shown in FIG. 16, first conductive material 440 is deposited in the opening in first masking layer 435. First conductive material 440 is, in this example, an electroplate alloy such as a nickel-cobalt alloy similar to the electroplate alloy described above with reference to the embodiment described with reference to FIGS. 2–13(d). As noted above with respect to the embodiment described in FIG. 13(b) and the accompanying text, it may be desirable to include an outer contact layer. Thus, where desired, a layer of contact metal can be plated, for example, above release layer 425. Suitable materials include palladium (Pd), palladium-cobalt (PdCo), gold (Au), and rhodium (Rh). A particularly preferred material is PdCo deposited to a thickness of about 0 to 5 microns but more can be used-even tens of microns or more. In a second preferred embodiment, the entire contact element is made of this material. In another preferred embodiment, only the final contact structure layer is made of this material. In a particularly preferred embodiment, some portion of the final contact structure layer is made of this material.

In one embodiment, first conductive material 440 is deposited to a thickness of at least the height of first masking material layer 435 and preferably greater than such height (overplating).

FIG. 17 shows structure 400 after the further processing step of planarizing first conductive material 440 and first masking layer 435 in accordance with an embodiment of the invention. The planarization is accomplished, for example, by a grinding procedure or a chemical-mechanical polish with a suitable slurry such as described above with reference to FIG. 5 and the accompanying text. The planarization step of FIG. 17 defines the height of the tip portion of a contact element.

In a first aspect of the second embodiment of the invention, the tip portion of first conductive material 440 may be removed and separately affixed to a contact element, such as for example, the contact element containing a post portion and a beam portion formed on an electronic component in FIG. 12(*a*) and brazed, soldered or otherwise combined with a tip portion as shown in FIG. 12(*b*). FIG. 18(*a*) shows structure 400 after the further processing step of removing first masking material layer 435. In the example where first masking material layer 435 is a photoresist, first masking material layer 435 may be removed by an oxygen ashing, laser ablation, or wet etching. Once first masking material layer 435 is removed, the tip portion of first conductive material 440 may be separated from substrate 410 at release layer 425. In the example where release layer 425 is aluminum, first conductive material 440 may be removed from substrate 410 by dissolving release layer 425 using sodium hydroxide (NaOH) solution as known in the art. Other methods of separation including but not limited to chemical etching and heat may also be suitable.

Before the tip portion of first conductive material 440 is separated from substrate 410, the tip portion may be combined with a post portion and a beam portion as shown in FIG. 18(*b*) by, for example, brazing, soldering, or welding. FIG. 18(*b*) shows an example of contact element 4001 coupled to electronic component 4000. Contact element 4001 includes post portion 4650 coupled to terminal 4010 of electronic component 4000, beam portion 4550 and tip portion 440 secured to beam portion 4550.

Figure 19D:
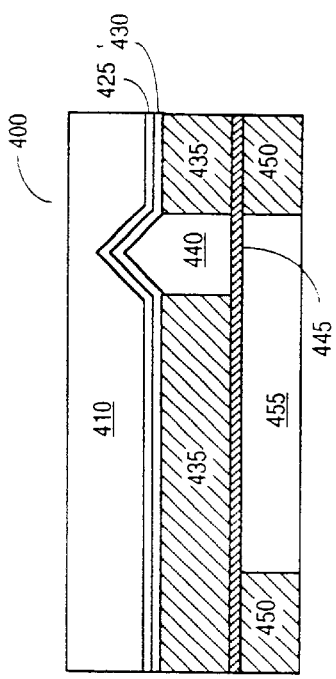
FIG. 19(d) shows the substrate of FIG. 17 after the further processing step of planarizing a second masking material layer and the second conductive material in accordance with a second aspect of a second embodiment of the invention.

FIG. 19(*a*) shows a second aspect of the second embodiment of the invention. Starting from structure 400 as shown in FIG. 17, FIG. 19(*a*) shows structure 400 after the further processing step of rendering a portion of first masking material layer 435 conductive to define an electrode area for a beam portion of the contact element that is to be formed in an electroplating process. As noted above (see FIG. 6 and the accompanying text), there are other methods of forming a beam portion that are also suitable.

FIG. 19(*a*) shows structure 400 after the further processing step of rendering an area on the surface of first masking material layer 435 conductive such that the area is suitable as an electrode for an electroplating process. In one embodiment, a portion of an area of first masking material layer 435 is covered with seed layer 445 of a conductive metal or a metal alloy such as titanium layer, titanium-tungsten alloy layer or a titanium or titanium-tungsten/gold bilayer. For an electroplated nickel/cobalt layer, for example, seed layer 445 has a thickness of approximately 5000 Å. As noted above with respect to FIG. 6 and the accompanying text, seed layer 445 may be deposited as a blanket layer or selectively as traces.

Next, as shown in FIG. 19(*b*), an area over structure 400 is covered with second masking material layer 450, again such as photoresist. Second masking material layer 450 is patterned to expose an area of seed layer 445 and define a beam portion of the contact element.

FIG. 19(*c*) shows structure 400 after the further processing step of depositing second conductive material 455 over the top surface of the structure. In one embodiment, second conductive material 455 is deposited through an electroplating process with an electroplating alloy such as nickel-cobalt. In the preferred embodiment, second conductive material 455 is deposited to a thickness of at least the thickness of second masking material layer 450, and generally greater than the thickness of second masking material layer 450 (overplating).

As shown in FIG. 19(*d*), after the deposition of second conductive material 455 over structure 400, second conductive material 445 and second masking material layer 450 are planarized by way of a grinding process or a chemical-mechanical polish such as described above to form a beam portion of the contact element on substrate 410, the beam portion having a known thickness defined by the planarization step. Reference is made at this point to FIGS. 10(*a*)–11(*b*) and the accompanying text that show various configurations for a beam portion of a contact element formed on an electronic component. It is to be appreciated that the same techniques may be used to form the beam portion having various configurations on sacrificial substrate 410.

Figure 20A:
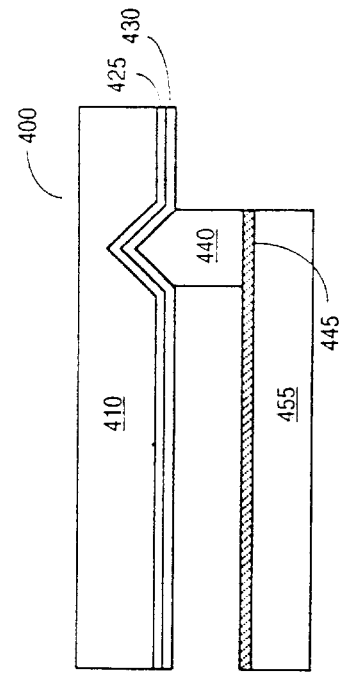
FIG. 20(a) shows the substrate of FIG. 19(d) after the further processing step of removing the first masking material layer and the second masking material layer to form a contact element including a beam portion and a tip portion in accordance with a third aspect of a second embodiment of the invention.

FIGS. 20(*a*) and 20(*b*) show a third aspect of the second embodiment of the invention. In this aspect, the tip portion and beam portion of the contact element may be removed from sacrificial substrate 410 and affixed to a separately formed post portion on an electronic component. To separate the tip portion of first conductive material 440 and beam portion of second conductive material 455, an oxygen plasma, laser ablation, or wet etch may be used to remove first masking material layer 435 and second masking material layer 450 in the example where first masking material layer 435 and second masking material layer 450 are photoresist. The technique chosen will generally remove the excess seed layer materials or these excesses may be removed separately as noted above.

First conductive material 440 may be separated at this point from sacrificial substrate 410 at release layer 425. In the example where release layer 425 is aluminum, one method of separating first conductive material 440 from sacrificial substrate 410 is by reacting release layer 425 with a NaOH solution. FIG. 20(*a*) shows tip portion of first conductive material 440 and beam portion of second conductive material 455 to be separated from sacrificial substrate 410. Beam portion of second conductive material 455 is to be affixed to separately fabricated post portion 4650 that is coupled to electronic component 4010 at a terminal of electronic component 4010. Post portion 4650 may be formed directly on an electronic component by the techniques described with reference to FIGS. 2–4 and the accompanying text. Beam portion of second conductive material 455 may be affixed to post portion 4650 after but preferably before separating tip portion of first conductive material 440 from sacrificial substrate 410. FIG. 20(*b*) shows the coupling such as, for example, by soldering, brazing, or welding.

Instead of separating a contact element containing a tip portion of first conductive material 440 and a beam portion of second conductive material 455 from sacrificial substrate 410, the second embodiment of the method of the invention alternatively contemplates the processing step of forming a post portion for the contact element. FIGS. 21(*a*)–21(*c*) illustrate this process.

FIG. 21(*a*) shows structure 400 of FIG. 19(*d*) after the further processing step of depositing seed layer 458 of a conductive metal or metal alloy, including, but not limited to, titanium or a titanium/gold bilayer.

Figure 21A:
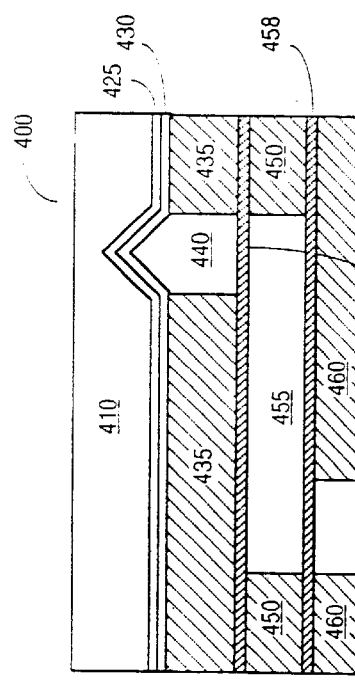
FIG. 21(a) shows the substrate of FIG. 19(d) after the further processing step of depositing a third masking material layer over the substrate and forming an opening to the second conductive material in accordance with a fourth aspect of a second embodiment of the invention.

FIG. 21(a) also shows structure 400 after the further processing step of patterning third masking material layer 460 over structure 400 and patterning an opening to second conductive material 455 at the distal end of second conductive material 455 (i.e., distal relative to the location of first conductive material 440). Third masking material layer 460 is, for example, a photoresist material similar to first masking material layer 435 and second masking material layer 450. Third masking material layer is patterned to a suitable height for a post portion of a contact element including consideration for a subsequent planarization step to define the height of the post portion. A complete discussion of the height considerations for the post portion of a contact element is provided herein with reference to FIG. 3 and the accompanying text.

Figure 21B:
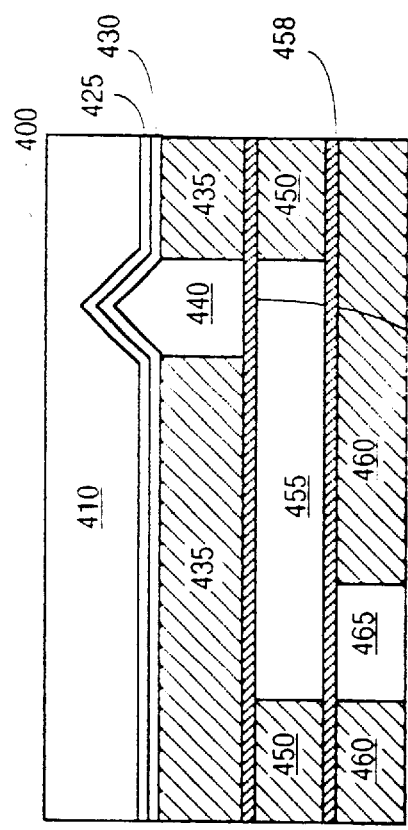
FIG. 21(b) shows the substrate of FIG. 19(d) after the further processing steps of depositing a third conductive material in the opening of a third masking material layer and planarizing the third masking material layer and the third conductive material in accordance with a fourth aspect of a second embodiment of the invention.

FIG. 21(b) shows structure 400 after the further processing step of depositing third conductive material 465 in the opening in third masking material layer 460, via, for example, an electroplate process. In one example, third conductive material 465 is nickel-cobalt similar to first conductive material 440 and second conductive material 455. Third conductive material 465 is preferably deposited to a thickness of at least the thickness of third masking material layer 460, and generally greater than the thickness of third masking material layer 460 (overplating). FIG. 21(b) also shows structure 400 after the further processing step of planarizing third conductive material 465 and third masking material layer 460 to define a post portion of third conductive material 465 having a thickness defined by the planarization step.

In the example where first masking material layer 435, second masking material layer 450, and third masking material layer 460 are photoresist, an oxygen ashing, laser ablation, or wet chemical etch step is first used to remove the masking material layer. At this point, contact element 470 can be separated from sacrificial substrate 410 at release layer 425. In the example where release layer 425 is aluminum, the aluminum is reacted with, for example, a NaOH solution to separate contact element 470 from sacrificial substrate 410.

Figure 21C:
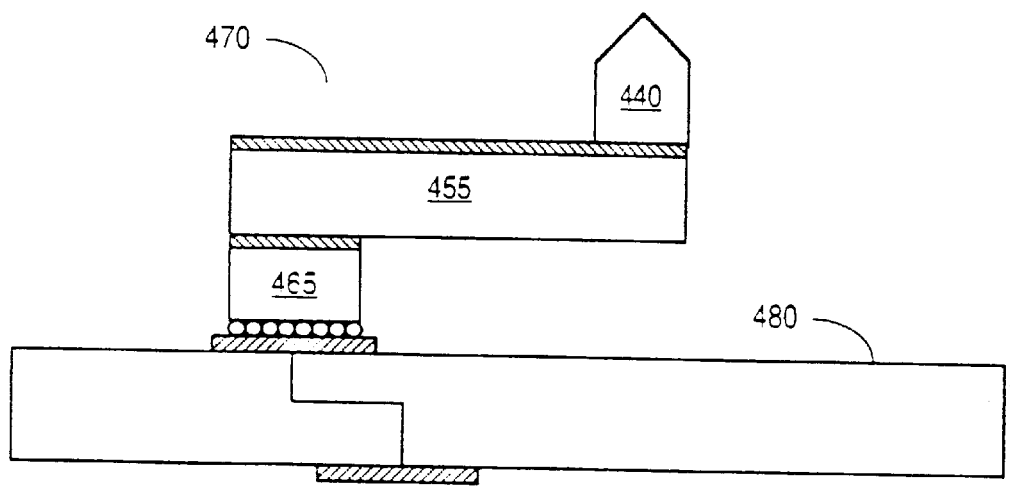
FIG. 21(c) shows an electronic component after the further processing step of affixing the contact element to a component in accordance with a fourth aspect of a second embodiment of the invention.

FIG. 21(c) shows contact element 470 coupled to electronic component 480 such as the space transformer of a probe card assembly. Contact element 470 is coupled at its post portion (of third conductive material 465) to a terminal of electronic component 480 by, for example, soldering, brazing, welding, conductive epoxy, tacking, or other technique.

Figure 20B:
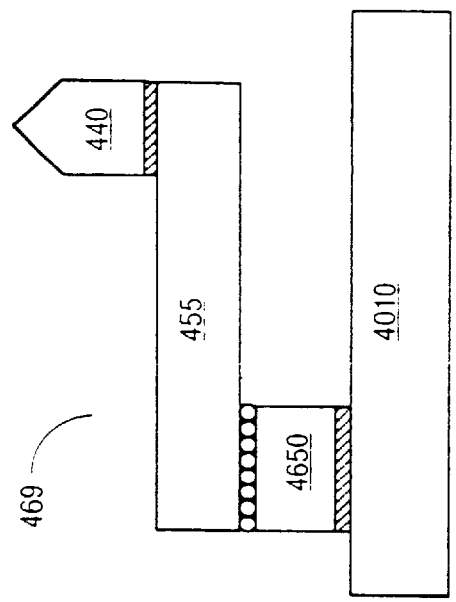
FIG. 20(b) shows the beam portion and tip portion of FIG. 20(a) after the further processing step of affixing the beam portion to a separately fabricated post portion to form a free standing contact element in accordance with a third aspect of a second embodiment of the invention.

Contact element 470 of FIG. 21(c) may be compared with contact element 469 of FIG. 20(b). In FIG. 20(b), beam portion 455 is secured to separately fabricated post portion 4650 by, for example, brazing or soldering. In FIG. 21(c), contact element 470 is formed into a single unit including a post portion, a beam portion, and a tip portion, by a series of deposition steps. In each case, the dimensions and the resiliency characteristics can be accurately controlled by utilizing lithographic techniques incorporating planarization steps.

Figure 22A:
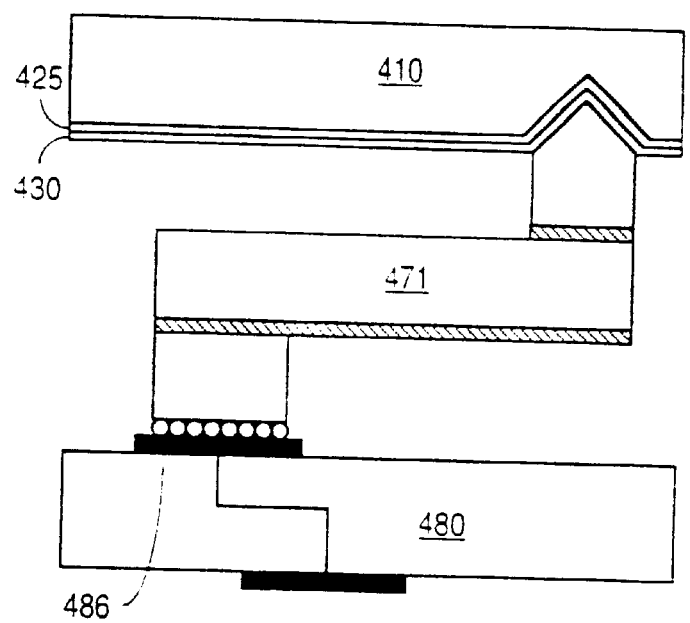
FIG. 22(a) shows a second method of affixing the contact element formed according to the fourth aspect of the second embodiment of the invention to an electronic component where the contact element remains affixed to the sacrificial substrate while the contact element is affixed to the electronic component.

FIG. 22(a) illustrates a second and preferred technique for mounting a contact element fabricated on a sacrificial substrate to an electronic component. FIG. 22(a) illustrates the technique where contact element 471 is fabricated on sacrificial substrate 410, for example, by the method described above with reference to FIGS. 14–21(b) and the accompanying text. FIG. 22(a) shows contact element 471 coupled to sacrificial substrate 410 at its tip portion. The first masking material layer, second masking material layer and third masking material layer utilized to pattern the contact element has been removed. As shown in FIG. 22(a), the post portion of contact element 471 is brought in the contact with a corresponding terminal 486 on electronic component 480, whereupon the post portion is suitably soldered, brazed, welded, etc., to terminal 486. It is to be appreciated that any suitable technique and/or material for affixing the post portion of contact element 471 to a terminal of an electronic component may be employed in each of the embodiments described above, including brazing, welding (e.g., spot welding) soldering, conductive epoxy, tacking the contact element in a suitable manner to the terminal and securely affixing the contact element to the terminal by plating (e.g., electroplating), and the like.

Figure 22B:
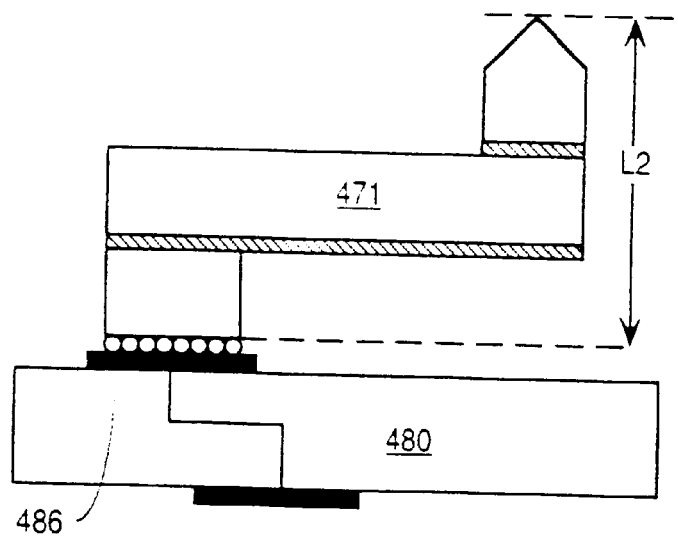
FIG. 22(b) shows the structure of FIG. 22(a) after the further processing step of separating the contact element from then sacrificial substrate.

Once contact element 471 is affixed to electronic component 480, sacrificial substrate 410 is removed in a suitable manner such as those described hereinabove (e.g., chemical etching, heating, dissolution of the release layer, etc.), resulting in electronic component 480 having contact element 471 affixed thereto, as illustrated in FIG. 22(b). As is evident in FIG. 22(b), a plurality of elongate or cantilever contact elements such as described can be affixed to an electronic component having a plurality of terminals on a surface thereof. In this embodiment, each contact element has a post portion, a beam portion, and a tip portion opposite the post portion. Each contact element is affixed at its post portion to a corresponding terminal of the electronic component. The tip portion of each contact element extends above the surface of the electronic component through a position that is laterally and/or transversely offset from its post portion forming a free-standing, cantilever structure.

In one embodiment, the contact element is resilient and is a spring contact element. When affixed to an electronic component, the contact element of the invention has an "effective" height of deflection of "L2," this being the distance between the highest portion of the tip portion and the inward most position where the post portion is affixed to electronic component 480. The actual height "$h_1$" represents the distance that the highest portion of tip portion 160 extends from electronic component 480. The distance between the underside of the beam portion and the surface of electronic component 480 is represented by "$h_2$" and represents the distance that the contact element can deflect in response to compressive forces applied at the tip portion thereof (e.g., at the tip and feature).

Figure 23:
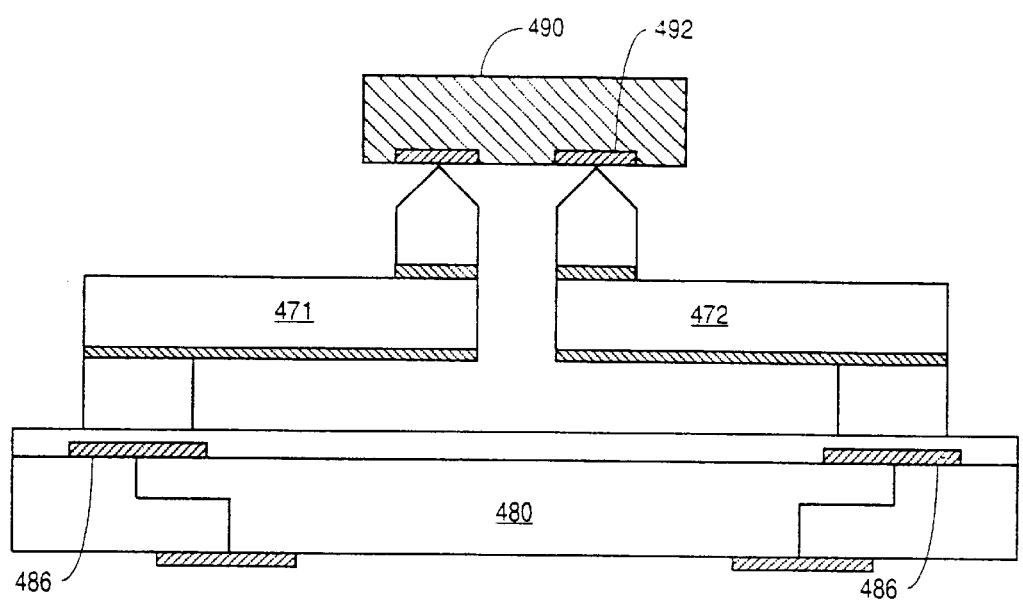
FIG. 23 shows a side view illustration of an application for an embodiment of the contact element of the invention affixed to an electronic component and contacting a terminal of a second electronic component.

FIG. 23 illustrates an application for an embodiment of the contact element of the invention, specifically a resilient contact element or spring contact element. In FIG. 23, contact elements 471 and 472 are affixed, for example, in the manner described with respect to FIG. 13(c) or FIG. 22(b) to a space transformer of probe card assembly so that tip portion ends 4711 and 4721 make pressure connections with terminals 492 of electronic component 490 such as a semiconductor device, or an area of a semiconductor wafer (not shown) containing a plurality of semiconductor devices.

Figure 24:
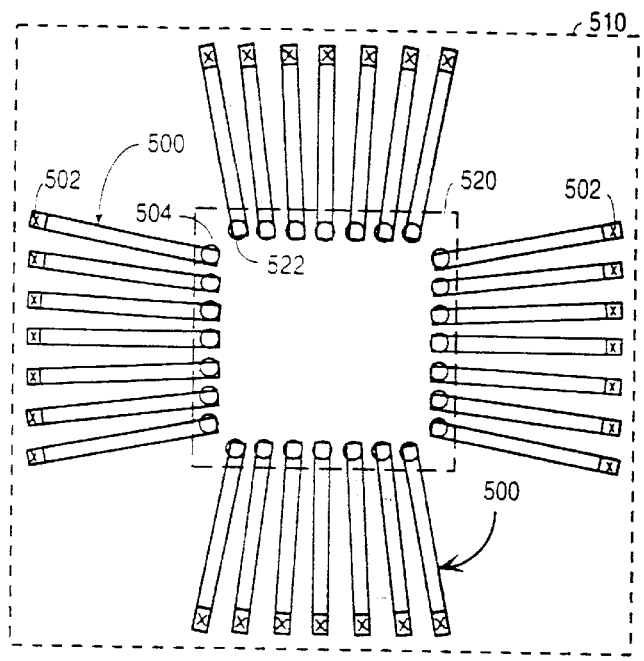
FIG. 24 shows a top view illustration of an application for an embodiment of the contact element of the invention wherein a plurality of contact elements are affixed to an electronic component and contact a plurality of terminals arranged along the edge of a second electronic component.

FIG. 24 illustrates an application wherein a plurality of contact elements 500 such as those described hereinabove are arranged on a substrate such as a space transformer of a probe card assembly and affixed thereto in the manner described hereinabove, so that their tip ends are disposed in a manner suitable for making contact with the bond pad of a semiconductor device having its terminals or bond pads arranged along its periphery. This application is similar to the application described in co-pending, commonly-owned U.S. patent application Ser. No. 08/802,054, titled "*Microelectronic Contact Structure, and Method of Making Same.*"

In FIG. 24, each contact element 500 includes post portion 502 and tip portion 504 and is mounted to an electronic component such as a space transformer (schematically illustrated by the dashed line 510) of a probe card assembly. Tip portion ends 504 are arranged in a pattern, mirroring the pattern of bond pads 522 (illustrated schematically by circles) of an electronic component (schematically illustrated by dashed line 520) such as a semiconductor device. Contact elements 500 "fan-out" from their tip portions 504, so that each of their post portions 502 is disposed at a greater pitch (spacing from one another) than their tip portions 504.

Figure 25:
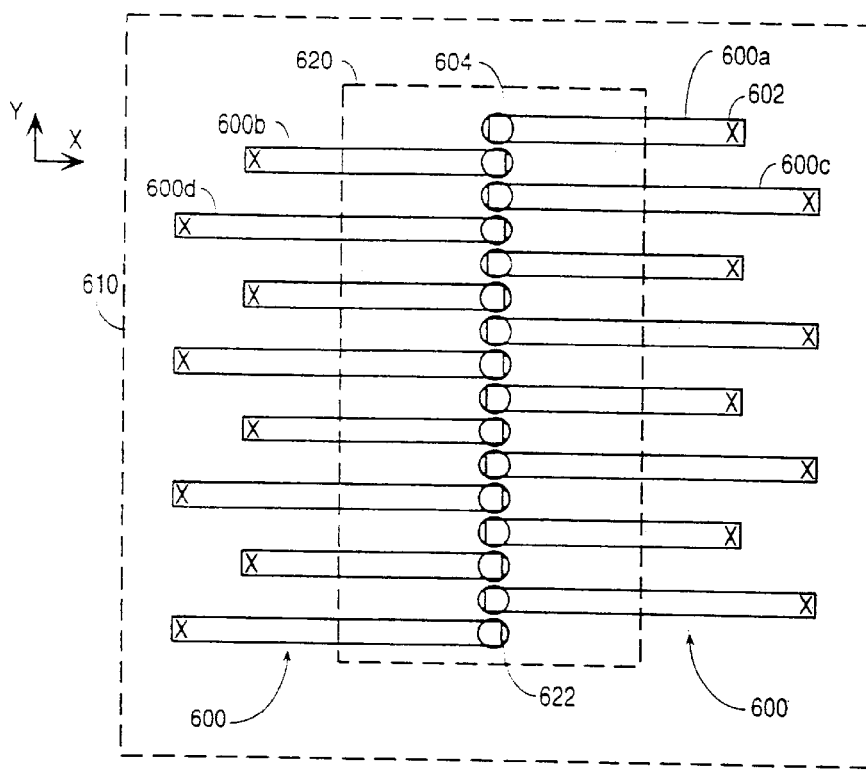
FIG. 25 shows a top view illustration of a second application for an embodiment of the contact element of the invention wherein a plurality of contact elements are affixed on an electronic component and contact terminals arranged in a row on a second electronic component.

FIG. 25 illustrates another application (also similarly described in co-pending, commonly-owned U.S. patent application Ser. No. 08/802,054 wherein a plurality of contact elements 600 such as those described hereinabove are arranged on a substrate such as a space transformer of a probe card assembly and affixed thereto in the manner described hereinabove, so that their tip portions are disposed in a manner suitable for making contact with the bond pads or terminals of a semiconductor device having its bond pads or terminals arranged in a row along a center line thereof. In FIG. 25, each contact element, generally denoted by reference numeral 600, includes post portion 602 and tip portion 604, and are mounted to an electronic component such as a space transformer of a probe card assembly (schematically illustrated by dashed line 610). Tip portions 604 are arranged, in a pattern mirroring that of bond pad 622 (illustrated schematically by circles) of an electronic component (schematically illustrated by dashed line 620) such as a semiconductor device. Contact elements 600 are arranged in the following sequence. A first contact element 600a is relatively short (e.g., has the length in an x-direction of approximately 60 mils), and is disposed to extend towards one side (right, as used) of electronic component 620. A second contact element 600b is adjacent first contact element 600a and is also relatively short (e.g., a length in an x-direction of approximately 60 mils), and is disposed to extend towards an opposite side (left, as used) of electronic component 620. Third contact element 600c is adjacent second contact element 600b and is relatively long (e.g., has a length in an x-direction of 80 mils), and is disposed to extend towards the one side (right, as used) of electronic component 620. Finally, fourth contact element 600d is adjacent third contact element 600c and is also relatively long (e.g., has a length in an x-direction of 80 mils), and is disposed to extend towards the opposite side (left, as used) of electronic component 620. In this manner, tip portions 604 are disposed at a fine pitch commensurate with that of bond pad 622, and post end 602 are disposed at a significantly greater pitch from one another.

Figure 26A:
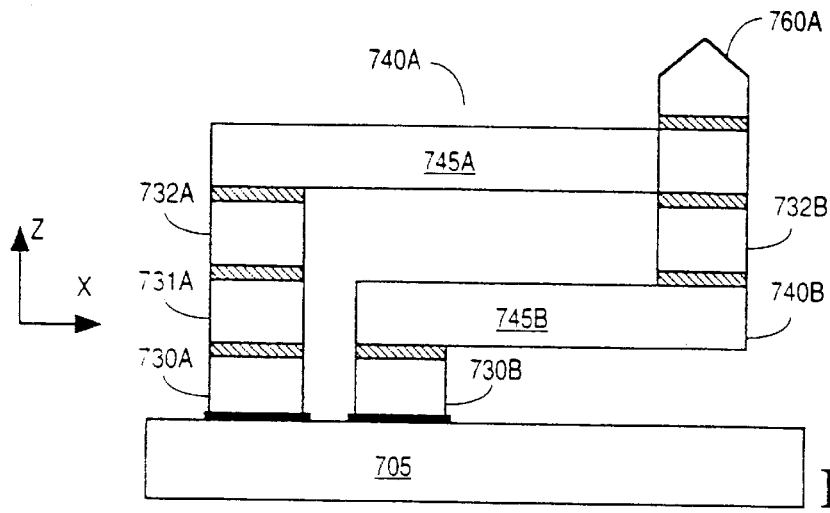
FIG. 26(a) shows a cross-sectional side view of a layout of adjacent contact elements fabricated with minimum spacing tolerances on a substrate in accordance with an embodiment of the invention.
Figure 26B:
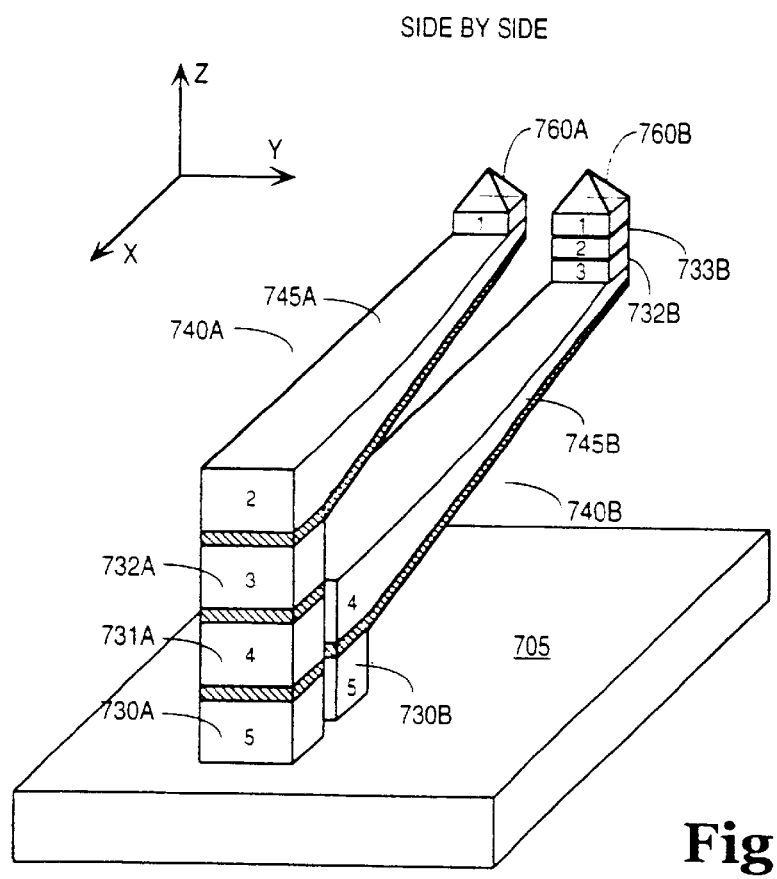
FIG. 26(b) shows a top perspective view of the layout of contact elements of FIG. 26(a) in accordance with an embodiment of the invention.

By using photolithographic techniques as described above, the contact elements according to the invention may be fabricated with minimal pitch. Accordingly, the contact elements according to the invention are well-suited to the fine-pitch, close-tolerance environment of micro-electronic components. FIGS. 26(a)–26(b) illustrate one layout where pitch between adjacent contact elements may be further minimized. FIGS. 26(a) and 26(b) show two different views of adjacent contact elements 740A and 740B. Adjacent contact elements 740A and 740B may be fabricated directly on an electronic component according to the methods described above, particularly with respect to FIGS. 2–13(c). In this manner, each masking material layer will be patterned to form individual portions of adjacent contact elements. For example, with reference to FIG. 3 hereinabove, first masking material layer 125 will be patterned, for example, with an opening for two post portions. First conductive material 130 will serve as the material for post portions 730A and 730B. Alternatively, contact elements 740A and 740B may be fabricated on a sacrificial substrate and transferred to an electronic component similar to the process steps above with respect to FIGS. 14–22(b) and the accompanying text.

Contact element 740A includes post portion 730A, beam portion 745A and tip portion 760A. As a further enhancement, contact element 740A also includes spacer portions 731A and 732A to separate, in this example, beam portion 745A of contact element 740A from underlying contact element 740B. In the manner where contact elements 740A and 740B are formed simultaneously, spacer portion 731A is patterned and formed at the same time as beam portion 745B of contact element 740B. Spacer portions in this embodiment are fabricated according to the techniques described for fabricating the post portions and beam portions of the contact elements (e.g., utilizing, in the first embodiment of the invention, a masking layer and mask having an opening, for example, over post portion 730A of contact element 740B and a second opening defining a beam portion for contact element 740B).

Contact element 740B includes post portion 730B, beam portion 745B and tip portion 760B. Contact element 740B further includes spacers 732B and 733B to align contact element 740B at a similar height (in a y-direction) as contact element 740A. In the manner where contact elements 740A and 740B are formed simultaneously, spacer portions 732A and 732B may be patterned in the same masking material layer (e.g., a third masking material layer in accordance with the ordering of the masking material layers with reference to FIGS. 2–13(c) and the accompanying text). Spacer portions 732A and 732B may then be formed of the same conductive material deposition (e.g., third conductive material 160 with reference to FIGS. 2–13(c) and the accompanying text). Similarly, spacer portion 733B of contact element 740A and beam portion 745A of contact element 740B may be patterned and formed simultaneously (e.g., of a fourth conductive material).

In this embodiment, using photolithographic techniques, the length of the rectangularly-shaped beam portions 745A and 745B of adjacent contact elements 740A and 740B may be varied. Adjacent contact elements 740A and 740B are fabricated along the same axis (e.g., x-axis) at their post portions (post portion 730A and 730B) and along a second axis (e.g., z-axis) at their tip portions (tip portions 760A and 760B). As noted, beam portion 745A of contact element 740A is patterned directly over post portion 730B of contact element 740B. Accordingly, in an x-direction, the post portions (730A and 730B) are axially aligned. At the tip portion of each contact element (760A and 760B), contact elements 740A and 740B are axially aligned along a y-axis. Thus, FIGS. 26(a) and 26(b) show adjacent contact elements that achieve a greater pitch between their tip portions and their post portions. Such a configuration is suitable, for example, to generate an electronic component with a plurality of contact elements for probing a second electronic component having its bond pads or terminals arranged along its periphery and having an ultra-fine pitch.

Figure 27A:
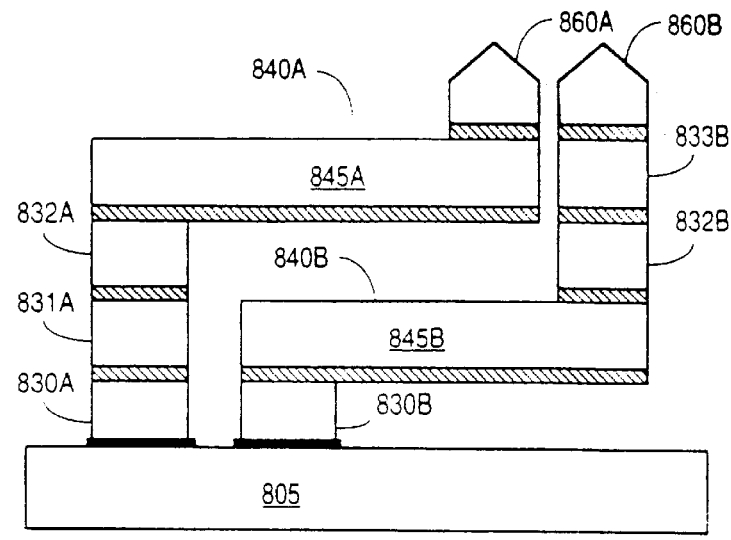
FIG. 27(a) shows a cross-sectional side view of a layout of adjacent contact elements fabricated with minimum spacing tolerances on a substrate in accordance with an embodiment of the invention.
Figure 27B:
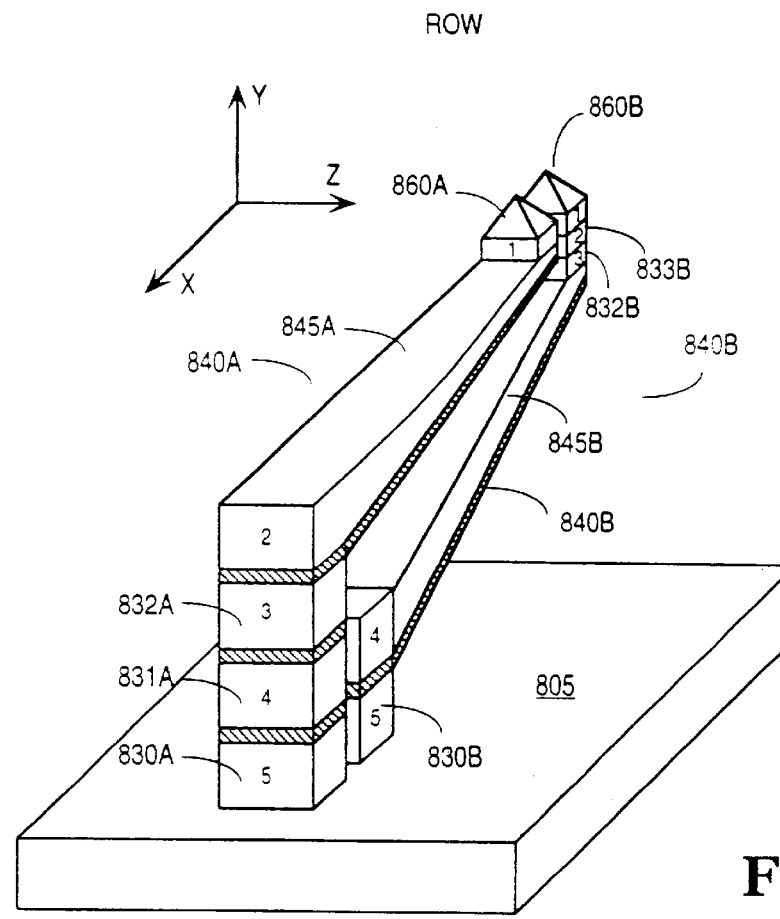
FIG. 27(b) shows a top perspective view of the layout of contact elements of FIG. 27(a) fabricated in accordance with an embodiment of the invention.

FIGS. 27(a)–27(b) describe a second orientation of adjacent contact elements according to an embodiment of the invention. Contact element 840A includes post portion 830A, beam portion 845A, and tip portion 860A. Contact element 840A also includes spacer portions 831A and 832A formed over post portion 830A. Spacer portions 831A and 832A, in this example, separate beam portion 845A from underlying contact element 840B. Contact element 840B includes post portion 830B, beam portion 845B, and tip portion 860B. Contact element 840B further includes spacer portions 832B and 833B that align tip portion 860B with tip portion 860A of contact element 840A along a y-axis. In FIGS. 27(a) and 27(b), contact elements 840A and 840B are axially aligned at both their post portions and their tip portions.

Adjacent contact elements 840A and 840B shown in FIGS. 27(a) and 27(b) are axially aligned in both their post portions and their tip portions. Using photolithographic techniques, the rectangularly-shaped beam portion of each contact element is fabricated to approximately the same length and the resulting contact element is offset by the distance between the post portions along the same axis. Such a configuration is suitable, for example, to generate an electronic component with a plurality of contact elements for probing a second electronic component having its bond pads or terminals arranged in an ultra-fine pitch row along a center line thereof.

Figure 28A:
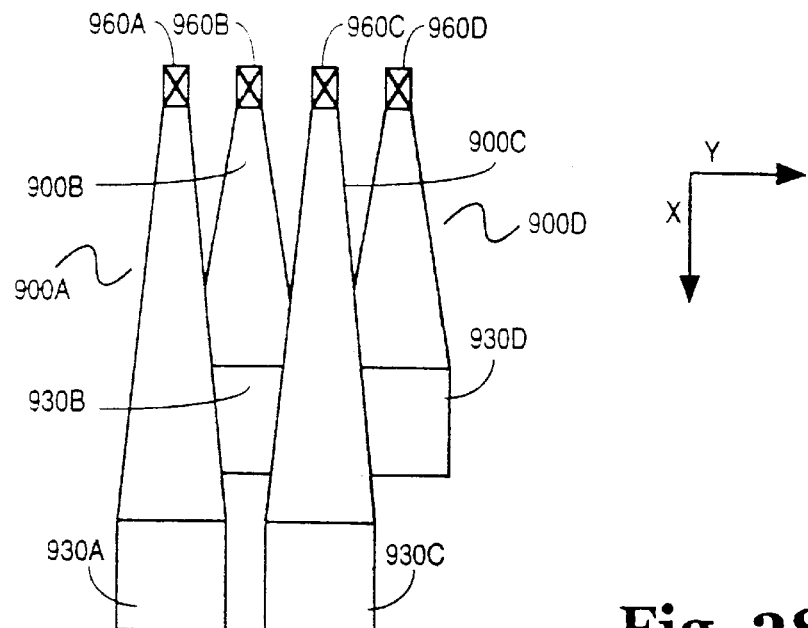
FIG. 28(a) shows a top view illustration of a plurality of contact elements affixed to an electronic component in an overlayed fashion so that their tip portions align in accordance with an embodiment of the invention.
Figure 28B:
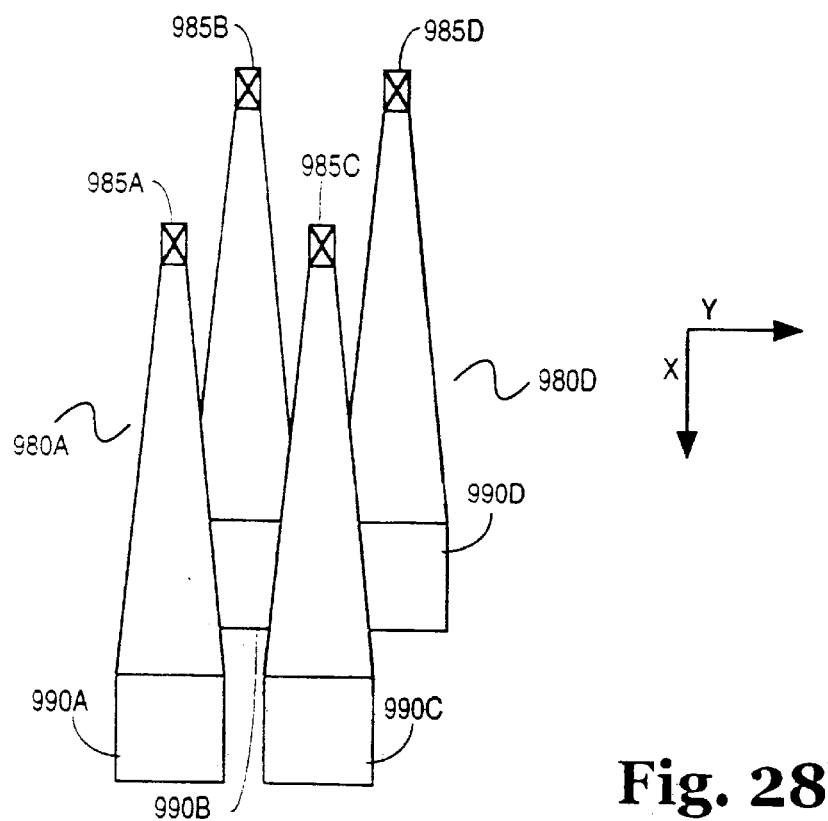
FIG. 28(b) shows a top view illustration of a plurality of contact elements affixed to an electronic component in an overlayed fashion so that their tip portions are staggered in accordance with an embodiment of the invention.

FIGS. 28(C) and 28(b) illustrate still further arrangements using similar overlaying patterning techniques for forming contact elements as described with reference to FIGS. 26(a)–27(b). FIG. 28(a) shows a plurality of contact element formed according to the techniques described hereinabove, arranged on an electronic component (not shown). Contact elements 900A, 900B, 900C, and 900D are arranged so that their corresponding tip portions 960A, 960B, 960C, and 960D, respectively, are aligned in a y-direction while base portions 930A, 930B, 930C, and 930D are staggered in an x-direction. FIG. 28(b) shows a second configuration wherein a plurality of contact elements 980A, 980B, 980C, and 980D are arranged on an electronic component (not shown) so that their corresponding tip portions 985A, 985B, 985C, and 985D, respectively are staggered in an x-direction as are their corresponding base portions 990A, 990B, 990C, and 990D, respectively.

FIGS. 24–28(b) relate to layouts of electronic component utilizing a contact element of the invention. It is to be appreciated, that the examples described in FIGS. 24–28(b) are merely exemplary and that a plurality of other configurations, including contact elements having more than two different lengths disposed on a common component are contemplated. It is also to be appreciated that the techniques illustrated in FIGS. 24–28(b) may be used to generate an electronic component with a plurality of contact elements in any arrangement required for probing of either peripheral or lead-on-center (LOC) devices.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A contact element comprising:
   a conductive post coupled to a first electronic component,
   a conductive beam coupled to said conductive post, said conductive beam comprising a beam material electroplated onto a seed material, and
   a conductive tip coupled to said conductive beam,
   wherein said seed material couples said conductive beam to one of said conductive post or said conductive tip.

2. The contact element of claim 1, wherein said conductive tip is electrically engagable with a second electronic component, whereby said contact element electrically couples said first electronic component with said second electronic component.

3. The contact element of claim 1, wherein at least a portion of said conductive beam extends away from said conductive post and comprises a surface having a width and a length, and width decreasing along said length as said surface extends away from said conductive post.

4. The contact element of claim 1, wherein at least a portion of said conductive beam extends away from said conductive post and comprises a surface that changes direction along a length thereof as said surface extends away from said conductive post.

5. The contact element of claim 1, wherein at least a portion of said conductive beam extends away from said conductive post and comprises a surface having a width and a length, said width varying along said length as said surface extends away from said conductive post.

6. The contact element of claim 1, wherein said conductive post includes at least one planarized surface.

7. The contact element of claim 1, wherein said conductive post and said conductive beam are coupled along a surface of said conductive post and said surface of said conductive post is planarized.

8. The contact element of claim 1, wherein said conductive beam includes at least one planarized surface.

9. The contact element of claim 1, wherein said conductive beam and said conductive tip are coupled along a surface of said conductive beam and said surface of said conductive beam is planarized.

10. The contact element of claim 1, wherein at least one of said conductive post, said conductive beam, and said conductive tip comprises a metal.

11. The contact element of claim 1, wherein said conductive beam is coupled to said conductive post at a first location along said conductive beam and said conductive tip is coupled to said conductive beam at a second location along said conductive beam.

12. The contact element of claim 1, wherein said conductive post, said conductive beam, and said conductive tip are structurally distinct one from another.

13. The contact element of claim 1, wherein said seed material couples said conductive beam to said conductive post.

14. The contact element of claim 1, wherein said seed material couples said conductive beam to said conductive tip.

15. An apparatus comprising:
   a first electronic component,
   a conductive post coupled to said first electronic component,
   a conductive beam coupled to said conductive post, said conductive beam comprising a beam material electroplated onto a seed material, and
   a conductive tip coupled to said conductive beam, and
   a second electronic component, said conductive tip electrically contacting said second electronic component, whereby said conductive post, said conductive beam, and said conductive tip electrically couple said first electronic component to said second electronic component,
   wherein said seed material couples said conductive beam to one of said conductive post or said conductive tip.

16. The apparatus of claim 15, wherein at least a portion of said conductive beam extends away from said conductive post and comprises a surface having a width and a length, said width decreasing along said length as said surface extends away from said conductive post.

17. The apparatus of claim 15, wherein at least a portion of said conductive beam extends away from said conductive post and comprises a surface that changes direction along a length thereof as said surface extends away from said conductive post.

18. The apparatus of claim 15, wherein at least a portion of said conductive beam extends away from said conductive post and comprises a surface having a width and a length, said width varying along said length as said surface extends away from said conductive post.

19. The apparatus of claim 15, wherein said conductive post includes at least one planarized surface.

20. The apparatus of claim 15, wherein said conductive post and said conductive beam are coupled along a surface of said conductive post and said surface of said conductive post is planarized.

21. The apparatus of claim 15, wherein said conductive beam includes at least one planarized surface.

22. The apparatus of claim 15, wherein said conductive beam and said conductive tip are coupled along a surface of said conductive beam and said surface of said conductive beam is planarized.

23. The apparatus of claim 15, wherein at least one of said conductive post, said conductive beam, and said conductive tip comprises a metal.

24. The apparatus of claim 15, wherein said conductive beam is coupled to said conductive post at a first location along said conductive beam and said conductive tip is coupled to said conductive beam at a second location along said conductive beam.

25. The apparatus of claim 15, wherein said conductive post, said conductive beam, and said conductive tip are structurally distinct one from another.

26. The apparatus of claim 15, wherein said seed material couples said conductive beam to said conductive post.

27. The apparatus of claim 15, wherein said seed material couples said conductive beam to said conductive tip.

28. An apparatus comprising:
an electronic component;
a first conductive contact structure coupled to a first terminal of said electronic component, said first conductive contact structure comprising:
a first conductive beam comprising a first beam material electroplated on a first seed material,
a first conductive tip in electrical communication with said first conductive beam, and
a first plurality of conductive posts, at least one of said first plurality of conductive posts electrically coupling said first terminal to said first conductive beam; and
a second conductive contact structure coupled to a second terminal of said electronic component, said second conductive contact structure comprising:
a second conductive beam comprising a second beam material electroplated on a second seed material,
a second conductive tip, and
a second plurality of conductive posts, at least one of said second plurality of conductive posts electrically coupled said second terminal to said second conductive beam at a first location along said second conductive beam, and at least one of said second plurality of conductive posts electrically coupled said second conductive tip to said second conductive beam at a second location along said second conductive beam.

29. The apparatus of claim 28, wherein
said first conductive beam and said second conductive beam are at different heights from a surface of said electronic component, and
said first conductive tip and said second conductive tip are at substantially a same height from a surface of said electronic component.

30. The apparatus of claim 28, wherein at least one of said first conductive post, said first conductive beam, and said first conductive tip comprises a metal.

31. The apparatus of claim 29, wherein said first seed material couples said first conductive beam to one of said first plurality of conductive posts.

32. The apparatus of claim 31, wherein said second seed material couples said second conductive beam to one of said second plurality of conductive posts.

33. An apparatus comprising:
a first electronic component having a first electrical terminal,
conductive post means attached to said first electronic component for electrically contacting said first electrical terminal,
conductive tip means for electrically contacting a second electrical terminal on a second electronic component, and
conductive beam means for electrically coupling said conductive post means to said conductive tip means, said conductive beam means comprising beam material electroplated onto a seed material,
wherein said seed material couples said conductive beam means to one of said conductive post means or said conductive tip means.

34. The apparatus of claim 33, wherein at least one of said conductive post means, said conductive beam means, and said conductive tip means comprises a metal.

35. The apparatus of claim 33, wherein said conductive beam means is coupled to said conductive post means at a first location along said conductive beam means and said conductive tip means is coupled to said conductive beam means at a second location along said conductive beam means.

36. The apparatus of claim 33, wherein said conductive post means, said conductive beam means, and said conductive tip means are structurally distinct one from another.

37. The apparatus of claim 33, wherein said seed material couples said conductive beam means to said conductive post means.

38. The apparatus of claim 33, wherein said seed material couples said conductive beam means to said conductive tip means.

* * * * *